US012690494B2

(12) United States Patent
Kim

(10) Patent No.: US 12,690,494 B2
(45) Date of Patent: Jul. 21, 2026

(54) SEMICONDUCTOR PACKAGE

(71) Applicant: SAMSUNG ELECTRONICS CO., LTD., Suwon-si (KR)

(72) Inventor: Jihoon Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 371 days.

(21) Appl. No.: 18/234,609

(22) Filed: Aug. 16, 2023

(65) Prior Publication Data

US 2024/0120299 A1    Apr. 11, 2024

(30) Foreign Application Priority Data

Oct. 5, 2022    (KR) ........................ 10-2022-0126969
Jan. 17, 2023    (KR) ........................ 10-2023-0006853

(51) Int. Cl.
| | |
|---|---|
| *H10W 90/00* | (2026.01) |
| *H10W 72/00* | (2026.01) |
| *H10W 72/90* | (2026.01) |
| *H10W 80/00* | (2026.01) |
| *H10W 90/26* | (2026.01) |

(52) U.S. Cl.
CPC ........... *H10W 90/00* (2026.01); *H10W 80/00* (2026.01); *H10W 72/01953* (2026.01); *H10W 72/90* (2026.01); *H10W 72/923* (2026.01); *H10W 72/926* (2026.01); *H10W 72/932* (2026.01); *H10W 72/934* (2026.01); *H10W 72/936* (2026.01); *H10W 72/942* (2026.01);

*H10W 72/944* (2026.01); *H10W 72/952* (2026.01); *H10W 90/26* (2026.01); *H10W 90/724* (2026.01); *H10W 90/792* (2026.01)

(58) Field of Classification Search
CPC ...... H10W 90/00; H10W 80/00; H10W 72/90
See application file for complete search history.

(56) References Cited

U.S. PATENT DOCUMENTS

| | | | |
|---|---|---|---|
| 9,412,725 | B2 | 8/2016 | Chen et al. |
| 10,886,255 | B2 | 1/2021 | Hong et al. |
| 11,222,873 | B2 | 1/2022 | Jun et al. |
| 11,244,927 | B2 | 2/2022 | Lee et al. |
| 2022/0013502 | A1 | 1/2022 | Lee et al. |

(Continued)

FOREIGN PATENT DOCUMENTS

KR    10-2020-0048771 A    5/2020

*Primary Examiner* — Jose R Diaz
(74) *Attorney, Agent, or Firm* — Sughrue Mion, PLLC

(57) ABSTRACT

A semiconductor package includes a first semiconductor structure including a first semiconductor substrate and a lower through structure that penetrates the first semiconductor substrate, a connection structure on the first semiconductor structure and a second semiconductor structure on the connection structure, the second semiconductor structure including a second semiconductor substrate and an upper through structure that penetrates the second semiconductor substrate, where the connection structure includes a lower curved pad on the lower through structure, and an upper curved pad on the lower curved pad, where a top surface of the lower curved pad includes a curved surface, where a bottom surface of the upper curved pad includes a curved surface, and where the upper curved pad is connected to the upper through structure.

20 Claims, 21 Drawing Sheets

(56)  References Cited

U.S. PATENT DOCUMENTS

| 2022/0037273 | A1 |   | 2/2022 | Park et al. |
| 2022/0157779 | A1 |   | 5/2022 | Kim |
| 2022/0216155 | A1 |   | 7/2022 | Won et al. |
| 2023/0361066 | A1 | * | 11/2023 | Chen .................... H10W 90/00 |

* cited by examiner

SEMICONDUCTOR PACKAGE

CROSS-REFERENCE TO RELATED APPLICATIONS

This application is based on and claims priority to Korean Patent Application No. 10-2023-0006853, filed on Jan. 17, 2023, in the Korean Intellectual Property Office, and Korean Patent Application No. 10-2022-0126969, filed on Oct. 5, 2022, in the Korean Intellectual Property Office, the disclosures of which are incorporated herein by reference in their entireties.

BACKGROUND

1. Field

Example embodiments of the disclosure relate to a semiconductor package, and more particularly, to a stacked semiconductor package.

2. Description of Related Art

In the semiconductor industry, high capacity, thinness, and small size of semiconductor devices and electronic products using the same are in demand and thus various package techniques have been developed. One approach may include a packaging technique which vertically stacks a plurality of semiconductor chips to achieve a high density chip stacking. This packaging technique includes an advantage of being capable of integrating semiconductor chips having various functions on a small area.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

Provided is a semiconductor package having increased bonding reliability.

Additional aspects will be set forth in part in the description which follows and, in part, will be apparent from the description, or may be learned by practice of the presented embodiments.

According to an aspect of an example embodiment, a semiconductor package may include a first semiconductor structure including a first semiconductor substrate and a lower through structure that penetrates the first semiconductor substrate, a connection structure on the first semiconductor structure and a second semiconductor structure on the connection structure, the second semiconductor structure including a second semiconductor substrate and an upper through structure that penetrates the second semiconductor substrate, where the connection structure may include a lower curved pad on the lower through structure, and an upper curved pad on the lower curved pad, where a top surface of the lower curved pad may include a curved surface, where a bottom surface of the upper curved pad may include a curved surface, and where the upper curved pad may be connected to the upper through structure.

According to an aspect of an example embodiment, a semiconductor package may include a first semiconductor structure including a first semiconductor substrate and a lower through structure that penetrates the first semiconductor substrate, a connection structure on the first semiconductor structure and a second semiconductor structure on the connection structure, the second semiconductor structure including a second semiconductor substrate and an upper through structure that penetrates the second semiconductor substrate, where the connection structure may include a lower dielectric layer on the first semiconductor substrate, at least one lower curved pad on the lower dielectric layer and connected to the lower through structure, and at least one lower connection pad on the lower dielectric layer and spaced apart from the at least one lower curved pad, where a top surface of the at least one lower curved pad may be at a level that is lower than a level of a top surface of the at least one lower connection pad.

According to an aspect of an example embodiment, a semiconductor package may include a first semiconductor structure including a first semiconductor substrate and a lower through structure that penetrates the first semiconductor substrate, a connection structure on the first semiconductor structure and a second semiconductor structure on the connection structure, the second semiconductor structure including a second semiconductor substrate and an upper through structure that penetrates the second semiconductor substrate, where the connection structure may include a lower dielectric layer on the first semiconductor substrate, an intervening layer on the lower dielectric layer, a lower curved pad on the lower through structure, and an upper curved pad on the lower curved pad, where a top surface of the lower curved pad may include a curved surface, where a bottom surface of the upper curved pad may include a curved surface, where the upper curved pad may be connected to the upper through structure and where a top surface of the intervening layer may be at a level that is lower than a level of the top surface of the lower curved pad.

BRIEF DESCRIPTION OF DRAWINGS

The above and other aspects, features, and advantages of certain example embodiments of the present disclosure will be more apparent from the following description taken in conjunction with the accompanying drawings, in which:

FIG. 2 a plan view illustrating upper curved pads of the semiconductor package depicted in FIG. 1 according to some embodiments of the disclosure;

FIG. 3 a plan view illustrating lower curved pads of the semiconductor package depicted in FIG. 1 according to some embodiments of the disclosure;

FIG. 7 is a plan view illustrating a semiconductor package according to some embodiments of the disclosure;

FIG. 8 is a plan view illustrating a semiconductor package according to some embodiments of the disclosure;

FIG. 9 is cross-sectional view illustrating section Qb of FIG. 6 according to some embodiments of the disclosure;

FIGS. 11, 12, 13, 14, 15, 16, 17 and 18 are cross-sectional views illustrating a method of fabricating a semiconductor package according to some embodiments of the disclosure;

DETAILED DESCRIPTION

Figure 1:
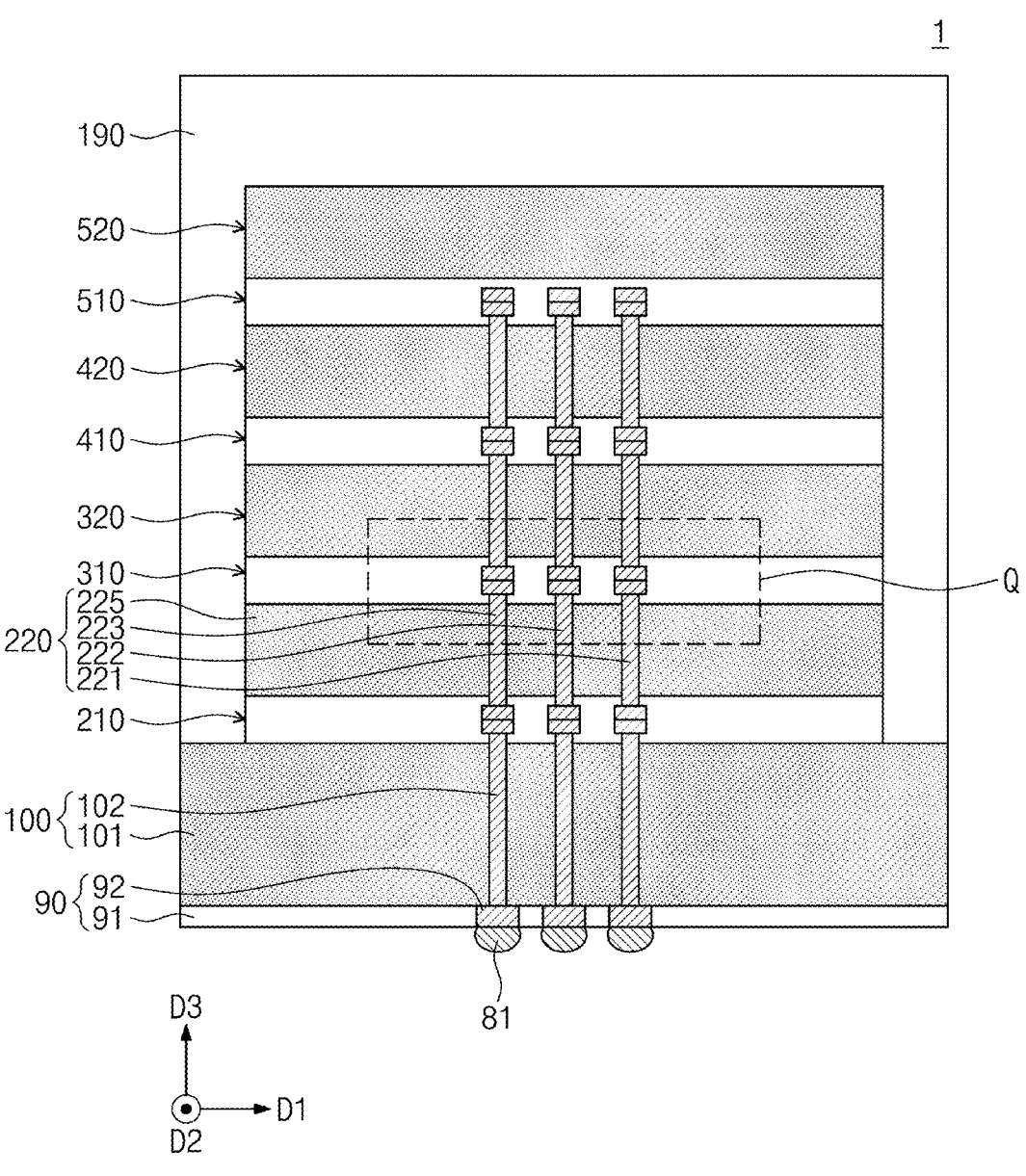
FIG. 1 is a cross-sectional view illustrating a semiconductor package according to some embodiments of the disclosure.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

FIG. 1 is a cross-sectional view illustrating a semiconductor package according to some embodiments of the disclosure. For convenience of description, description of some components may be omitted or many of components will be merged into a single configuration in FIG. 1.

A semiconductor package according to some embodiments of the disclosure may be a stacked package using a through structure. For example, semiconductor chips of the same kind may be stacked on a base substrate, and the semiconductor chips may be electrically connected via through structures that penetrate therethrough. The semiconductor chips may be bonded to each other through their pads that face each other.

Referring to FIG. 1, a semiconductor package 1 according to some embodiments of the disclosure may have a plate shape that expands along a plane defined by a first direction D1 and a second direction D2. The first direction D1 and the second direction D2 may intersect each other. For example, the first direction D1 and the second direction D2 may be orthogonal to each other. The semiconductor package 1 according to some embodiments of the disclosure may include a solder ball 81, a solder layer 90, a base structure 100, a first connection structure 210, a first semiconductor structure 220, a second connection structure 310, a second semiconductor structure 320, a third connection structure 410, a third semiconductor structure 420, and a molding layer 190.

The solder ball 81 may be provided. The solder ball 81 may include a conductive material. The solder ball 81 may be electrically connected to the base structure 100, the first semiconductor structure 220, the second semiconductor structure 320, and the third semiconductor structure 420. The solder ball 81 may electrically connect the base structure 100, the first semiconductor structure 220, the second semiconductor structure 320, and the third semiconductor structure 420 to an external apparatus.

The solder layer 90 may be provided on the solder ball 81. The solder layer 90 may include a solder dielectric layer 91 and a solder pad 92. The solder dielectric layer 91 may surround a lateral surface of the solder pad 92.

The solder dielectric layer 91 may include a dielectric material. The solder dielectric layer 91 may include, for example, at least one selected from silicon oxide (SiO), silicon nitride (SiN), and silicon oxynitride (SiON).

The solder pad 92 may include a conductive material. The solder pad 92 may include one or more of, for example, copper (Cu), aluminum (Al), and nickel (Ni). The solder pad 92 may be electrically connected to the solder ball 81.

The base structure 100 may be provided on the solder layer 90. The base structure 100 may include, for example, a base substrate 101 and a base through via 102.

The base substrate 101 may include an integrated circuit therein. For example, the base substrate 101 may be a wafer-level die formed of a semiconductor such as silicon (Si). In some embodiments, the base substrate 101 may be a substrate (e.g., a printed circuit board (PCB)), which does not include an electronic device such as transistor.

The first connection structure 210 may be interposed between the base substrate 101 and the first semiconductor substrate 225. The first connection structure 210 may have a structure similar to that of the second connection structure 310 which will be described below. The base substrate 101 and the first semiconductor substrate 225 may be attached to each other through the first connection structure 210. The base substrate 101 and the first semiconductor substrate 225 may be electrically connected through the first connection structure 210.

The first semiconductor structure 220 may be provided on the first connection structure 210. The first semiconductor structure 220 may include a first semiconductor substrate 225 and a plurality of lower through structures 221, 222, and 223. The plurality of lower through structures 221, 222, and 223 may include a first lower through structure 221, a second lower through structure 222, and a third lower through structure 223. The first lower through structure 221, the second lower through structure 222, and the third lower through structure 223 may penetrate the first semiconductor substrate 225.

The first semiconductor substrate 225, the base structure 100, and the solder ball 81 may be electrically connected through the first lower through structure 221, the second lower through structure 222, and the third lower through structure 223.

The second connection structure 310 may be provided on the first semiconductor substrate 225. The second connection structure 310 may be interposed between the first semiconductor substrate 225 and a second semiconductor substrate (see 325 of FIG. 4).

The second semiconductor structure 320 may be provided on the second connection structure 310. The second semiconductor structure 320 may have a structure similar to that of the first semiconductor structure 220.

The third connection structure 410 may be provided on the second semiconductor structure 320. The third connection structure 410 may have a structure similar to that of the first and second connection structures 210 and 310.

The third semiconductor structure 420 may be provided on the third connection structure 410. The third semiconductor structure 420 may have a structure similar to that of the first and second semiconductor structures 220.

A fourth connection structure 510 may be provided on the third semiconductor structure 420. The fourth connection structure 510 may have a structure similar to that of the first, second, and third connection structures 210, 310, and 410.

A fourth semiconductor structure 520 may be provided on the fourth connection structure 510. The fourth semiconductor structure 520 may be similar to the first semiconductor structure 220, except components that correspond to the first lower through structure 221, the second lower through structure 222, and the third lower through structure 223.

The molding layer 190 may be provided on the base structure 100. The molding layer 190 may be provided to surround the first connection structure 210, the first semiconductor structure 220, the second connection structure 310, the second semiconductor structure 320, the third connection structure 410, and the third semiconductor structure 420. The molding layer 190 may include a dielectric material. For example, the molding layer 190 may include an epoxy molding compound (EMC).

Figure 2:
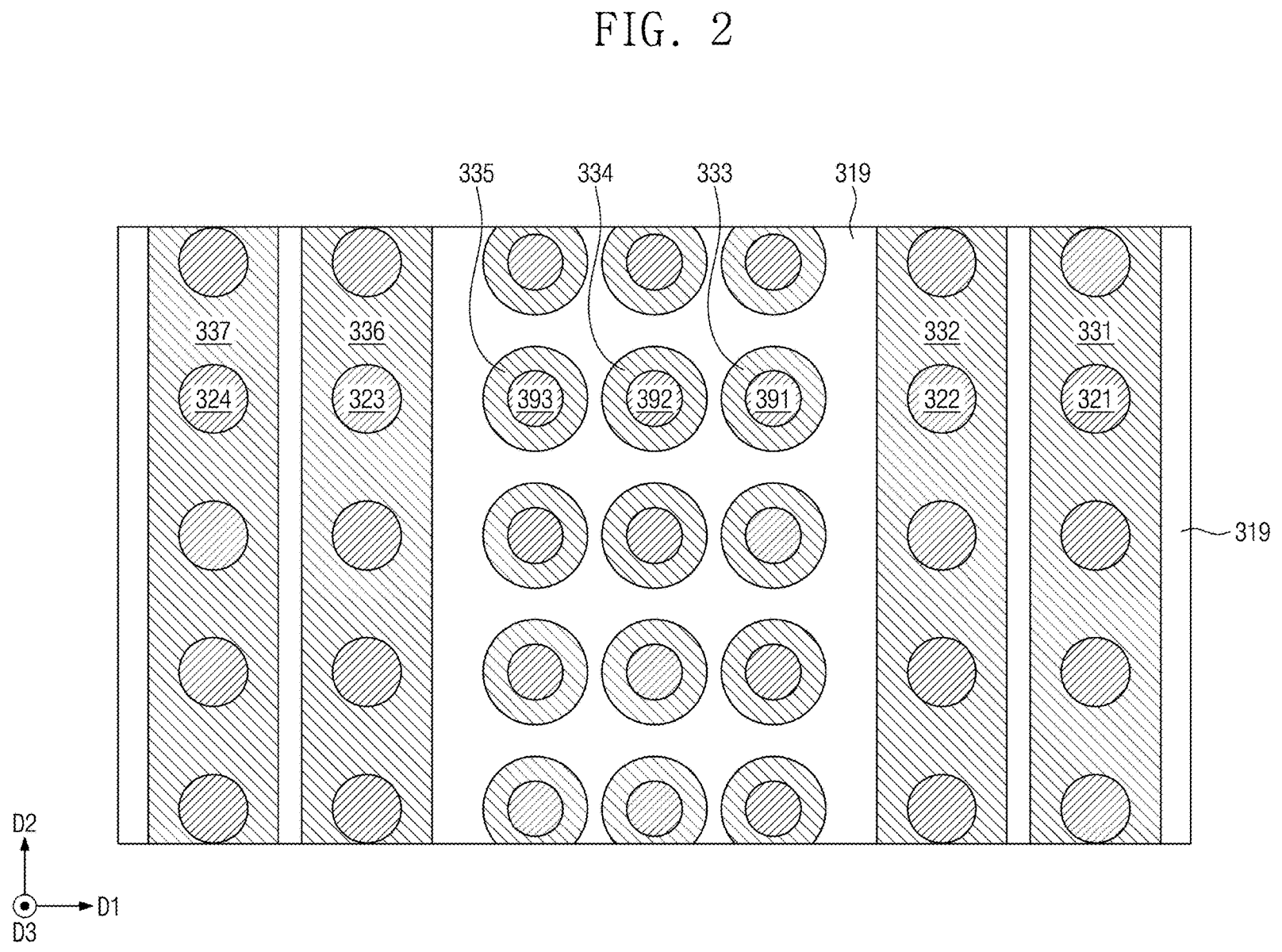
Figure 3:
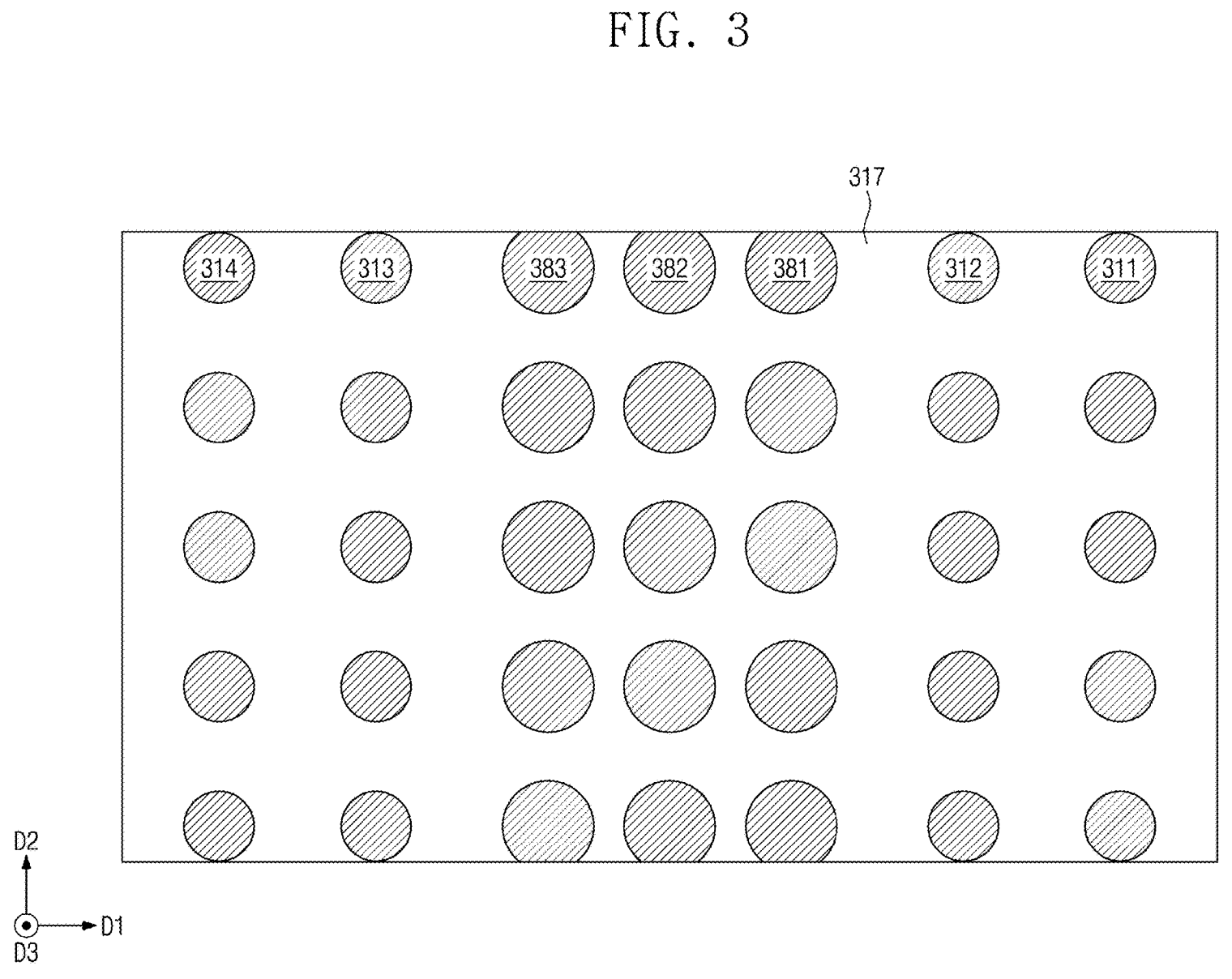
Figure 4:
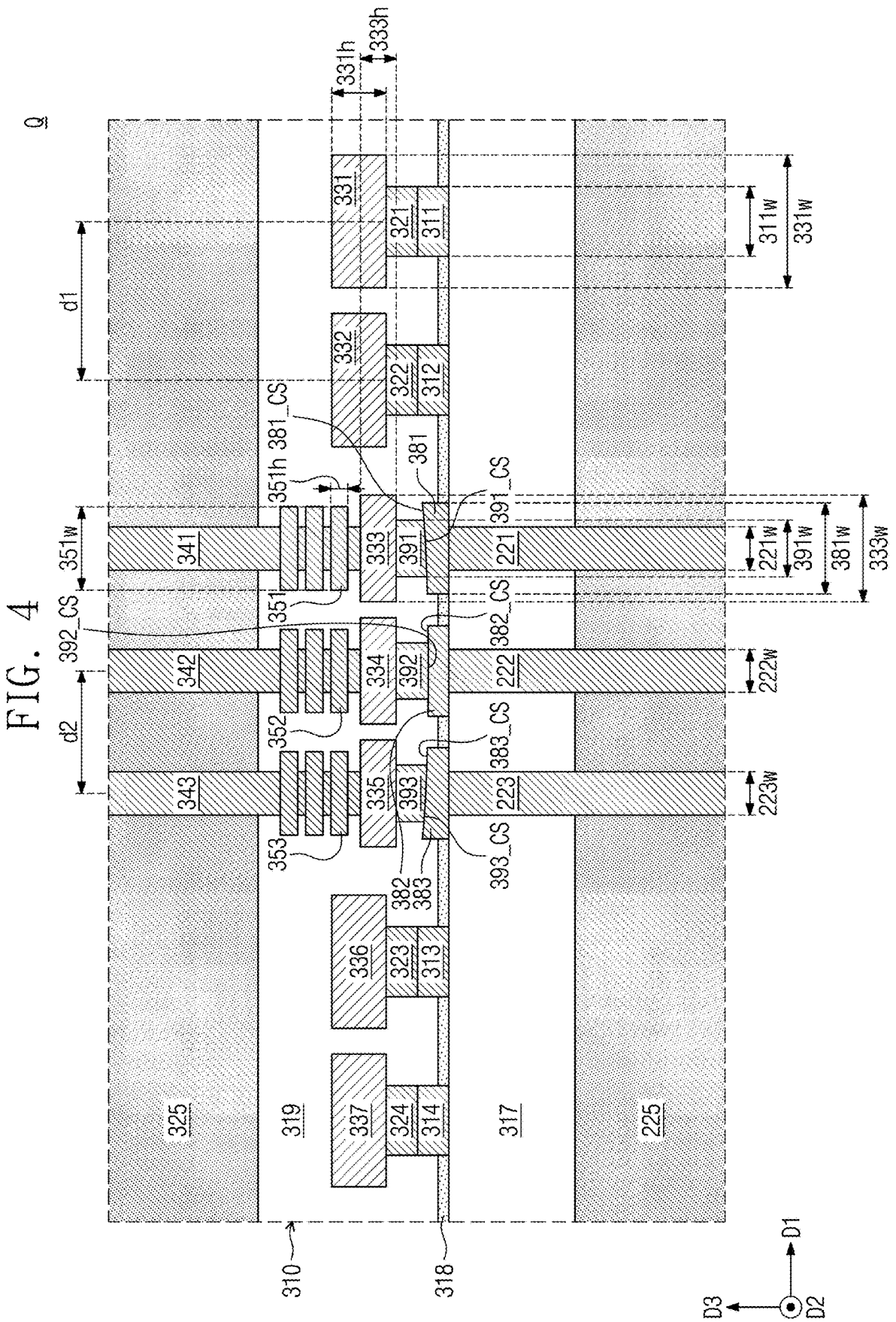
FIG. 4 is a cross-sectional view of section Q of FIG. 1 according to some embodiments of the disclosure.
Figure 5:
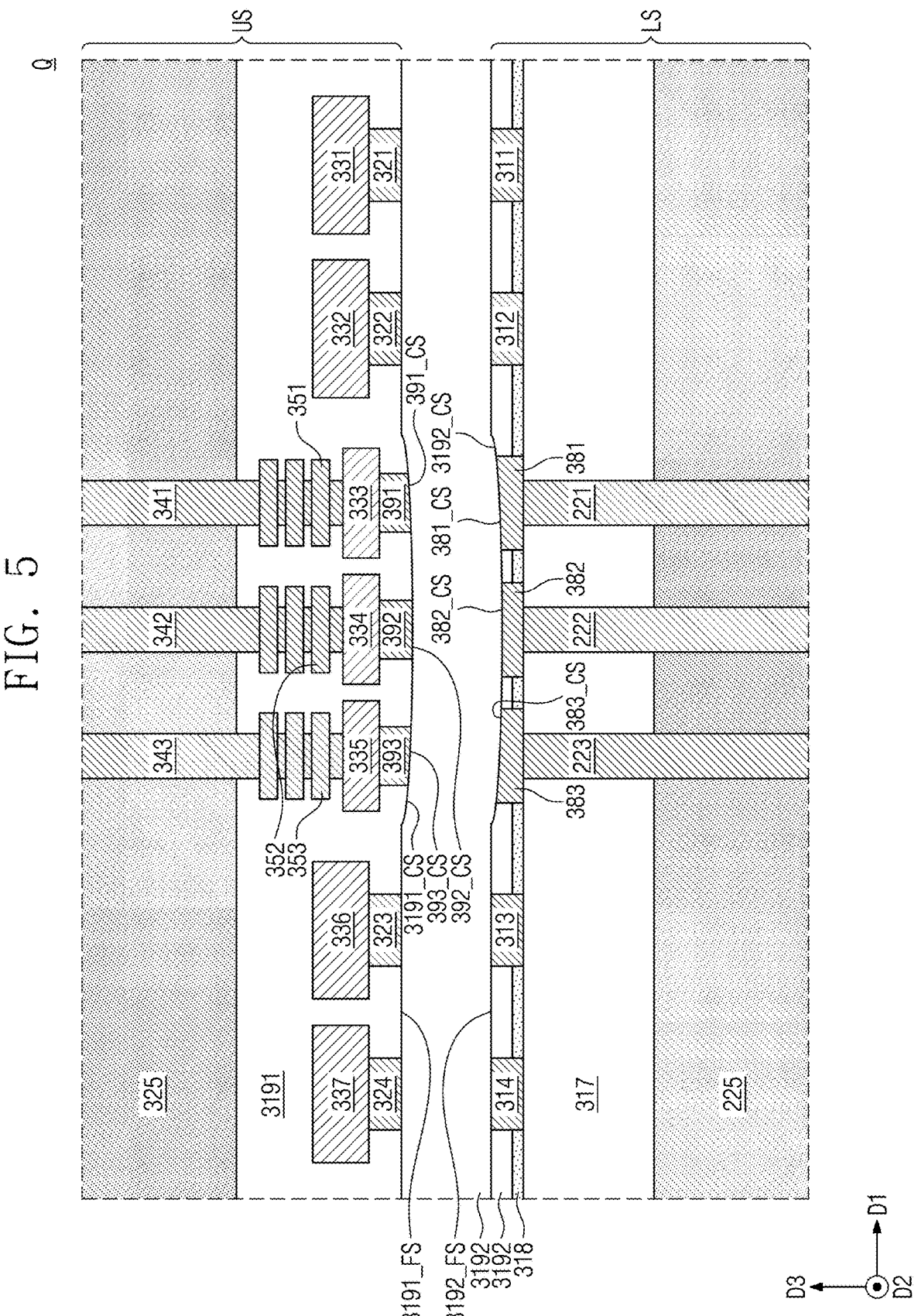
FIG. 5 is a cross-sectional view illustrating bonding between semiconductor substrates according to some embodiments of the disclosure.

FIG. 2 a plan view illustrating upper curved pads of the semiconductor package depicted in FIG. 1 according to some embodiments of the disclosure. FIG. 3 a plan view illustrating lower curved pads of the semiconductor package depicted in FIG. 1 according to some embodiments of the disclosure. FIG. 4 is a cross-sectional view of section Q of FIG. 1 according to some embodiments of the disclosure. FIG. 5 is a cross-sectional view illustrating bonding between semiconductor substrates according to some embodiments of the disclosure.

Referring to FIGS. 2, 3, and 4, the second connection structure 310 may be interposed between the first semiconductor substrate 225 and the second semiconductor substrate 325. The second connection structure 310 may be formed by bonding upper and lower structures US and LS which will be described below. The second connection structure 310 may include a lower dielectric layer 317, an intervening layer 318 on the lower dielectric layer 317, lower connection pads 311, 312, 313, and 314 on the lower dielectric layer 317, lower curved pads 381, 382, and 383 on the lower dielectric layer 317, a bonding dielectric layer 319 on the intervening layer 318, upper connection pads 321, 322, 323, and 324 on the lower connection pads 311, 312, 313, and 314, upper curved pads 391, 392, and 393 on the lower curved pads 381, 382, and 383, upper connection topmost pads 331, 332, 336, and 337 on the upper connection pads 321, 322, 323, and 324, upper round topmost pads 333, 334, and 335 on the upper curved pads 391, 392, and 393, and upper conductive pads 351, 352, and 353 on the upper round topmost pads 333, 334, and 335. In FIG. 2, the upper round topmost pads 333, 334 and 335 are depicted as having a round shape, but other shapes of the upper topmost pads 333, 334 and 335 may be implemented as will be understood by one of skill in the art from the disclosure herein. Additionally, reference is made throughout the disclosure to upper round topmost pads, such as pads 333b, 334b, 335b, 333c, 334c, 335c, etc., but other shapes of the upper topmost pads, such as pads 333b, 334b, 335b, 333c, 334c, 335c, etc. may be implemented as will be understood by one of skill in the art from the disclosure herein.

Referring to FIG. 2, in a plan view, the bonding dielectric layer 319 may have a plate shape that expands in the first direction D1 and the second direction D2.

The upper connection pads 321, 322, 323, and 324 may include a plurality of first upper connection pads 321, a plurality of second upper connection pads 322, a plurality of third upper connection pads 323, and a plurality of fourth upper connection pads 324.

The upper connection topmost pads 331, 332, 336, and 337 may include a first connection topmost pad 331, a second connection topmost pad 332, a third connection topmost pad 336, and a fourth connection topmost pad 337. The first, second, third, and fourth connection topmost pads 331, 332, 336, and 337 may be spaced apart from each other in the first direction D1.

The first upper connection pads 321 may each have a circular shape. The first upper connection pads 321 may include a conductive material. The first upper connection pads 321 may be disposed spaced apart from each other in the second direction D2. The first connection topmost pad 331 may have a rectangular shape in which a side length in the second direction D2 is greater than a side length in the first direction D1. The first connection topmost pad 331 may overlap the plurality of first upper connection pads 321.

The first connection topmost pad 331 and the second connection topmost pad 332 may be adjacent to each other. The third connection topmost pad 336 and the fourth connection topmost pad 337 may be adjacent to each other. The first upper connection pad 321 and the second upper connection pad 322 may be adjacent to each other. The third upper connection pad 323 and the fourth upper connection pad 324 may be adjacent to each other.

The plurality of upper round topmost pads 333, 334, and 335 may be disposed between the second connection topmost pad 332 and the third connection topmost pad 336. The plurality of upper curved pads 391, 392, and 393 may be disposed between the second upper connection pad 322 and the third upper connection pad 323.

The plurality of upper round topmost pads 333, 334, and 335 may include a plurality of first round topmost pads 333, a plurality of second round topmost pads 334, and a plurality of third round topmost pads 335. The plurality of upper curved pads 391, 393, and 393 may include a plurality of first upper curved pads 391, a plurality of second upper curved pads 392, and a plurality of third upper curved pads 393.

The plurality of first round topmost pads 333 may be arranged spaced apart from each other in the second direction D2. The plurality of first round topmost pads 333 may include a conductive material. The plurality of first round topmost pads 333 may each have a circular shape.

The plurality of first upper curved pads 391 may be arranged spaced apart from each other in the second direction D2. The plurality of first upper curved pads 391 may include a conductive material. The plurality of first round topmost pads 333 may each have a circular shape.

The first round topmost pad 333 and the first upper curved pad 391 may be concentric circles. The first round topmost pad 333 may have a diameter greater than that of the first upper curved pad 391. The first round topmost pad 333 may be positioned on the first upper curved pad 391 and may overlap the first upper curved pad 391.

The above mentioned description may apply similarly to the second, third, and fourth upper connection pads 322, 323, and 324 and the second, third, and fourth connection topmost pads 332, 336, and 337.

Referring to FIG. 3, n a plan view, the lower dielectric layer 317 may have a plate shape that expands in the first direction D1 and the second direction D2.

The lower connection pads 311, 312, 313, and 314 and the lower curved pads 381, 382, and 383 may each have a circular shape. The lower curved pads 381, 382, and 383 may each have a diameter greater than that of each of the lower connection pads 311, 312, 313, and 314.

The lower connection pads 311, 312, 313, and 314 may include a plurality of first lower connection pads 311, a plurality of second lower connection pads 312, a plurality of third lower connection pads 313, and a plurality of fourth lower connection pads 314. The plurality of first lower connection pads 311 may be disposed spaced apart from each other in the second direction D2. The plurality of lower connection pads 311 may be adjacent to the plurality of second lower connection pads 312.

The lower curved pads 381, 382, and 383 may include a plurality of first lower curved pads 381, a plurality of second lower curved pads 383, and a plurality of third lower curved pads 383. The first lower curved pads 381 may be disposed spaced apart from each other in the second direction D2. The first, second, and third lower curved pads 381, 382, and 383 may be spaced apart from each other in the first direction D1.

The first lower curved pads 381, the second lower curved pads 382, and the third lower curved pads 383 may be disposed between the second lower connection pads 312 and the third lower connection pads 313.

Referring to FIG. 4, the lower dielectric layer 317 may be disposed on the first semiconductor substrate 225. The lower dielectric layer 317 may include a dielectric material. The lower through structures 221, 222, and 223 may be provided to penetrate the first semiconductor substrate 225 and the lower dielectric layer 317. The lower through structures 221, 222, and 223 may include a first lower through structure 221, a second lower through structure 222, and a third lower through structure 223 that are spaced apart from each other.

The lower dielectric layer 317 may be provided thereon with the first lower connection pad 311, the second lower connection pad 312, the third lower connection pad 313, the fourth lower connection pad 314, the first lower curved pad 381, the first lower curved pad 381, the second lower curved pad 382, and the third lower curved pad 383, each of which penetrates the intervening layer 318.

The lower curved pads 381, 382, and 383 may have their top surfaces at a lower level than that of top surfaces of the lower connection pads 311, 312, 313, and 314.

The intervening layer 318 may include a dielectric material. The intervening layer 318 may include a different material from that of the lower dielectric layer 317. The intervening layer 318 may include, for example, silicon nitride. The intervening layer 318 may have a top surface at a lower level than that of the top surface of the first lower connection pad 311 and that of the top surface of the first lower curved pad 381.

The first, second, third, and fourth lower connection pads 311, 312, 313, and 314 may have their bottom surfaces coplanar with a top surface of the lower dielectric layer 317.

The first upper connection pad 321 may be provided on the first lower connection pad 311. The first upper connection pad 321 and the first lower connection pad 311 may be electrically connected. The first upper connection pad 321 and the first lower connection pad 311 may include a conductive material. The first upper connection pad 321 and the first lower connection pad 311 may include, for example, copper. The above mentioned description may apply to the second, third, and fourth upper connection pads 322, 323, and 324 and the second, third, and fourth lower connection pads 312, 313, and 314.

The first upper curved pad 391 may be provided on the first lower curved pad 381. The first lower curved pad 381 and the first upper curved pad 391 may be electrically connected. The first lower curved pad 381 and the first upper curved pad 391 may include a conductive material. The first lower curved pad 381 and the first upper curved pad 391 may include, for example, copper. The first lower curved pad 381 may have a curved top surface 381_CS. The first upper curved pad 391 may have a curved bottom surface 391_CS. The top surface 381_CS of the first lower curved pad 381 may have the same curvature as that of the bottom surface 391_CS of the first upper curved pad 391. The above mentioned description may also apply to a top surface 382_CS of the second lower curved pad 381, a bottom surface 392_CS of the second upper curved pad 392, a top surface 383_CS of the third lower curved pad 383, and a bottom surface 393_CS of the third upper curved pad 393.

The first connection topmost pad 331 may be provided on the first upper connection pad 321. The first connection topmost pad 331 may include a conductive material. The first connection topmost pad 331 may include, for example, aluminum. The first connection topmost pad 331 may include a different material from that of the first upper connection pad 321.

The first round topmost pad 333 may be provided on the first upper curved pad 391. The first round topmost pad 333 may include a conductive material. The first round topmost pad 333 may include, for example, aluminum. The first round topmost pad 333 may include a different material from that of the first upper curved pad 391.

The first upper curved pad 391 may have a top surface at a lower level than that of a top surface of the first upper connection pad 321. The first lower through structure 221 may have a width $221w$ less than a width $391w$ of the first lower curved pad 391. The width $221w$ of the first lower through structure 221 may be, for example, equal to or less than about 4 μm. The width $391w$ of the first upper curved pad 391 may be less than a width $381w$ of the first lower curved pad 381. The width $381w$ of the first lower curved pad 381 may be less than a width $333w$ of the first round topmost pad 333. The width $391w$ of the first lower curved pad 391 may be less than a width $311w$ of the first lower connection pad 311. The width $333w$ of the first round topmost pad 333 may be less than a width $331w$ of the first connection topmost pad 331. The width $333w$ of the first round topmost pad 333 may be, for example, equal to or less than about 8 μm. The width $311w$ of the first lower connection pad 311 may be less than the width $331w$ of the first connection topmost pad 331. The first round topmost pad 333 may have a height $333h$ less than a height $331h$ of the first connection topmost pad 331. The height $331h$ of the first connection topmost pad 331 may be, for example, equal to or less than about 2.5 μm. The upper connection topmost pads 331, 332, 336, and 337 may have their top surfaces at a higher level than that of top surfaces of the upper round topmost pads 333, 334, and 335.

Upper through structures 341, 342, and 343 may be disposed on the upper round topmost pads 333, 334, and 335. The upper through structures 341, 342, and 343 may include a first upper through structure 341, a second upper through structure 342, and a third upper through structure 343.

The first upper through structure 341 may be disposed on the first round topmost pad 333. A first conductive pad 351 may be disposed on the first round topmost pad 333, and the first conductive pad 351 may have a width so as to overlap the first upper through structure 341. A similar configuration may be applied the second upper through structure 342, the second conductive pad 352, the third upper through structure 343, and the third conductive pad 353.

The first round topmost pad 333 and the first conductive pad 351 may be spaced apart from each other. A plurality of first conductive pads 351 may be included that are spaced apart from each other in a third direction D3. A topmost one of the plurality of first conductive pads 351 may have a top surface at a lower level than that of a top surface of the bonding dielectric layer 319. The first conductive pad 351 may have a width 351$w$ less than the width 333$w$ of the first round topmost pad 333. The first conductive pad 351 may have a height 351$h$ less than the height 331$h$ of the first connection topmost pad 331. The height 351$h$ of the first conductive pad 351 may be less than the height 333$h$ of the first round topmost pad 333.

The bonding dielectric layer 319 may cover lateral and top surfaces of the upper connection topmost pads 331, 332, 336, and 337, and may also cover lateral surfaces of the upper round topmost pads 333, 334, and 335. The bonding dielectric layer 319 may include a dielectric material. A second semiconductor substrate 325 may be disposed on the bonding dielectric layer 319.

The upper through structures 341, 342, and 343 may penetrate the second semiconductor substrate 325. A value of equal to or less than about 30 μm may be given as a distance d1 between a center of the first upper connection pad 321 and a center of the second upper connection pad 322. A value of equal to or less than about 30 μm may be given as a distance d2 between a center of the second upper through structure 342 and a center of the third upper through structure 343.

As the second connection structure 310 has the lower curved pads 381, 382, and 383 and the upper curved pads 391, 392, and 393, topology of a semiconductor chip may be compensated.

Referring to FIG. 5, there may be provided an upper structure US and a lower structure LS immediately before the second connection structure 310 is formed. The upper structure US may be provided on the lower structure LS. For convenience of description, a detailed explanation of technical features repetitive to that described above may be omitted.

The lower structure LS may include a first semiconductor substrate 225, a lower dielectric layer 317 on the first semiconductor substrate 225, an intervening layer 318 on the lower dielectric layer 317, a first curved dielectric layer 3192 on the intervening layer 318, lower through structures 221, 222, and 223 that penetrate the first semiconductor substrate 225 and the lower dielectric layer 317, lower curved pads 381, 382, and 383 on the lower through structures 221, 222, and 223, and lower connection pads 311, 312, 313, and 314.

The first semiconductor substrate 225 may include a semiconductor material. For example, the first semiconductor substrate 225 may be a monocrystalline silicon (Si) substrate.

The first curved dielectric layer 3192 may include a lower flat surface 3192_FS and a lower curved surface 3192_CS. The lower flat surface 3192_FS and the lower curved surface 3192_CS may be continuously connected without cutoff.

The lower flat surface 3192_FS may be a flat portion of a top surface of the first curved dielectric layer 3192. The lower flat surface 3192_FS may be coplanar with top surfaces of the lower connection pads 311, 312, 313, and 314. The lower flat surface 3192_FS may be located at a higher level than that of a bottommost portion of the lower curved surface 3192_CS.

The lower curved surface 3192_CS may have a downwardly concave shape. The lower curved surface 3192_CS may be coplanar with top surfaces 381_CS, 382_CS, and 383_CS of the lower curved pads 381, 382, and 383.

All of bottom surfaces of the lower connection pads 311, 312, 313, and 314 may contact the lower dielectric layer 317.

A first lower curved pad 381 may be provided on a first lower through structure 221. A second lower curved pad 382 may be provided on a second lower through structure 222. A third lower curved pad 383 may be provided on a third lower through structure 223.

The upper structure US may include a second curved dielectric layer 3191, a second semiconductor substrate 325 on the second curved dielectric layer 3191, upper connection pads 321, 322, 323, and 324 in the second curved dielectric layer 3191, upper connection topmost pads 331, 332, 336, and 337 on the upper connection pads 321, 322, 323, and 324, upper round topmost pads 333, 334, and 335 on upper curved pads 391, 392, and 393, upper through structures 341, 342, and 343 that penetrate the second curved dielectric layer 3191 and the second semiconductor substrate 325, and upper conductive pads 351, 352, and 353 on the upper round topmost pads 333, 334, and 335.

The second curved dielectric layer 3191 may include an upper flat surface 3191_FS and an upper curved surface 3191_CS. The upper flat surface 3191_FS and the upper curved surface 3191_CS may be continuously connected without cutoff. The second curved dielectric layer 3191 may include silicon oxide.

The upper flat surface 3191_FS may be a flat portion of a bottom surface of the second curved dielectric layer 3191. The upper flat surface 3191_FS may be coplanar with bottom surface of the upper connection pads 321, 322, 323, and 324. The upper flat surface 3191_FS may be located at a higher level than that of a bottommost portion of the upper curved surface 3191_CS.

The upper curved surface 3191_CS may have a downwardly concave shape. The upper curved surface 3191_CS may be coplanar with bottom surfaces 391_CS, 392_CS, and 393_CS of the upper curved pads 391, 392, and 393. The lower curved surface 3192_CS may have the same curvature as that of the upper curved surface 3191_CS.

The bottom surface 391_CS of the first upper curved pad 391 may contact the top surface 381_CS of the first lower curved pad 381. The bottom surface 392_CS of the second upper curved pad 392 may contact the top surface 382_CS of the second lower curved pad 382. The bottom surface 393_CS of the third upper curved pad 393 may contact the top surface 383_CS of the third lower curved pad 383. The lower curved surface 3192_CS and the upper curved surface 3191_CS may contact each other. In this case, the first curved dielectric layer 3192 and the second curved dielectric layer 3191 may be bonded into a single unitary body. The first curved dielectric layer 3192 and the second curved dielectric layer 3191 may be integrally connected to form the bonding dielectric layer 319.

The upper structure US and the lower structure LS may be bonded to each other as described above to form the second connection structure 310 that connects the first semiconductor substrate 225 to the second semiconductor substrate 325.

As the width 333$w$ of the first round topmost pad 333 is less than the width 331$w$ of the first connection topmost pad 331, a metal density of a section where the first round topmost pad 333 is present may be less than that of a section where the first connection topmost pad 331. The first lower curved pad 381 may be disposed to be overlapped by the first round topmost pad 333 around which the metal density is low, and thus there may be a reduction in bonding topology between the first semiconductor structure 220 and the second semiconductor structure 320.

Figure 6:
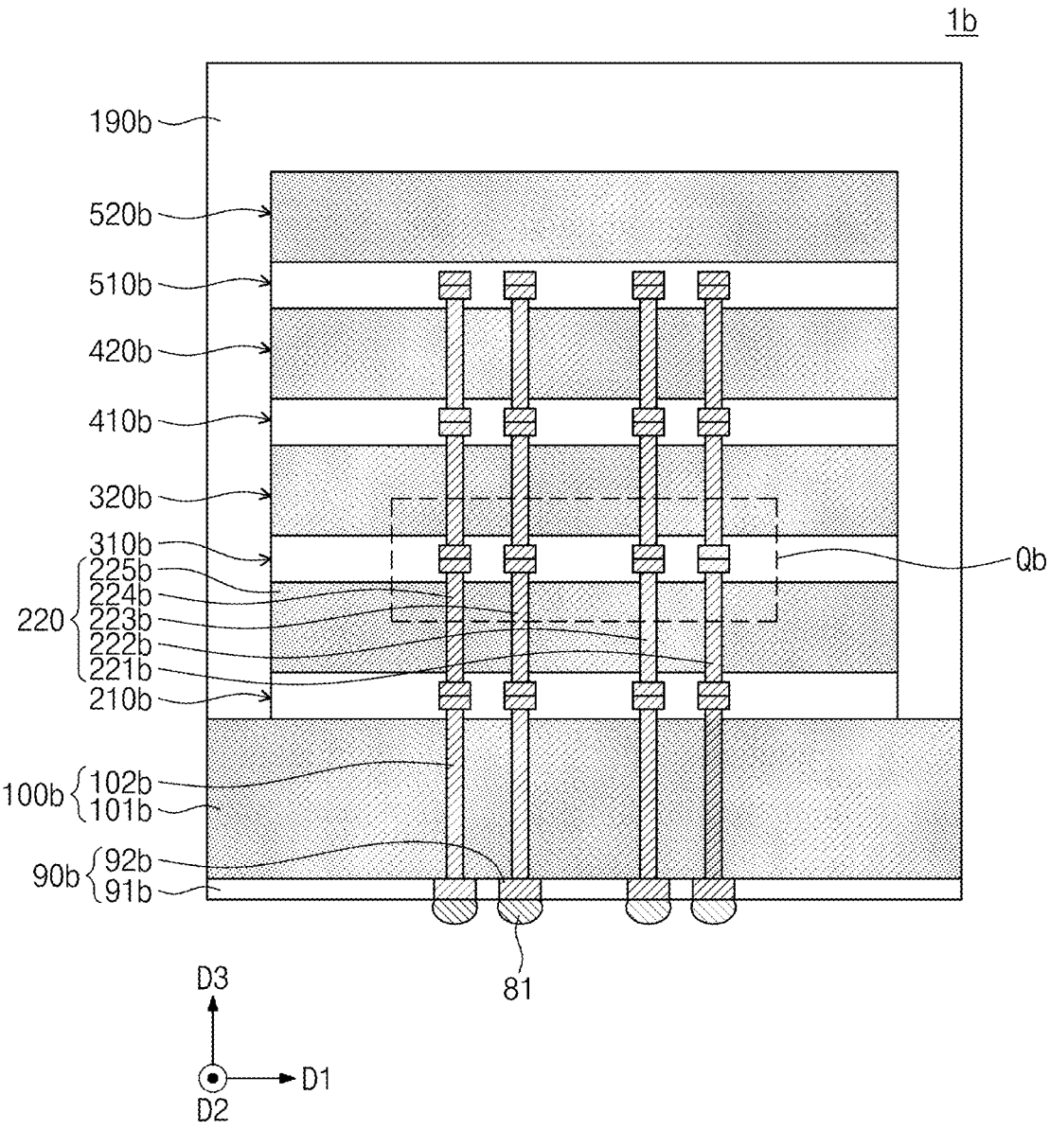
FIG. 6 is a cross-sectional view illustrating a semiconductor package according to some embodiments of the disclosure.

FIG. 6 is a cross-sectional view illustrating a semiconductor package according to some embodiments of the disclosure.

Referring to FIG. 6, a semiconductor package 1*b* may be provided. For convenience of description, some components may be omitted or many of components will be merged into a single configuration in FIG. 6. For convenience of description, a detailed explanation of technical features repetitive to that described above may be omitted.

The semiconductor package 1*b* according to some embodiments of the disclosure may include a solder ball 81*b*, a solder layer 90*b*, a base structure 100*b*, a first connection structure 210*b*, a first semiconductor structure 220*b*, a second connection structure 310*b*, a second semiconductor structure 320*b*, a third connection structure 410*b*, a third semiconductor structure 420*b*, and a molding layer 190*b*.

The solder layer 90*b* may be provided on the solder ball 81*b*. The solder layer 90*b* may include a solder dielectric layer 91*b* and a solder pad 92*b*.

The base structure 100*b* may be provided on the solder layer 90*b*. The base structure 100*b* may include, for example, a base substrate 101*b* and a base through via 102*b*.

The first connection structure 210*b* may be interposed between the base substrate 101*b* and the first semiconductor structure 220*b*. The first semiconductor structure 220*b* may be provided on the first connection structure 210*b*. The first semiconductor structure 220*b* may include a first semiconductor substrate 225*b* and a plurality of lower through structures 221*b*, 222*b*, 223*b*, and 224*b*. The plurality of lower through structures 221*b*, 222*b*, 223*b*, and 224*b* may include a first lower through structure 221*b*, a second lower through structure 222*b*, a third lower through structure 223*b*, and a fourth lower through structure 224*b*. The first lower through structure 221*b*, the second lower through structure 222*b*, the third lower through structure 223*b*, and the fourth lower through structure 224*b* may penetrate the first semiconductor substrate 225*b*.

The first semiconductor substrate 225*b*, the base structure 100*b*, and the solder ball 81*b* may be electrically connected through the first lower through structure 221*b*, the second lower through structure 222*b*, the third lower through structure 223*b*, and the fourth lower through structure 224*b*.

A distance between the second lower through structure 222*b* and the third lower through structure 223*b* may be greater than that between the first lower through structure 221*b* and the second lower through structure 222*b*.

The second connection structure 310*b* may be provided on the first semiconductor substrate 225*b*. The second semiconductor structure 320*b* may be provided on the second connection structure 310*b*. The third connection structure 410*b* may be provided on the second semiconductor structure 320*b*. The third semiconductor structure 420*b* may be provided on the third connection structure 410*b*. A fourth connection structure 510*b* may be provided on the third semiconductor structure 420*b*. A fourth semiconductor structure 520*b* may be provided on the fourth connection structure 510*b*. The molding layer 190*b* may be provided on the base structure 100*b*.

Figure 7:
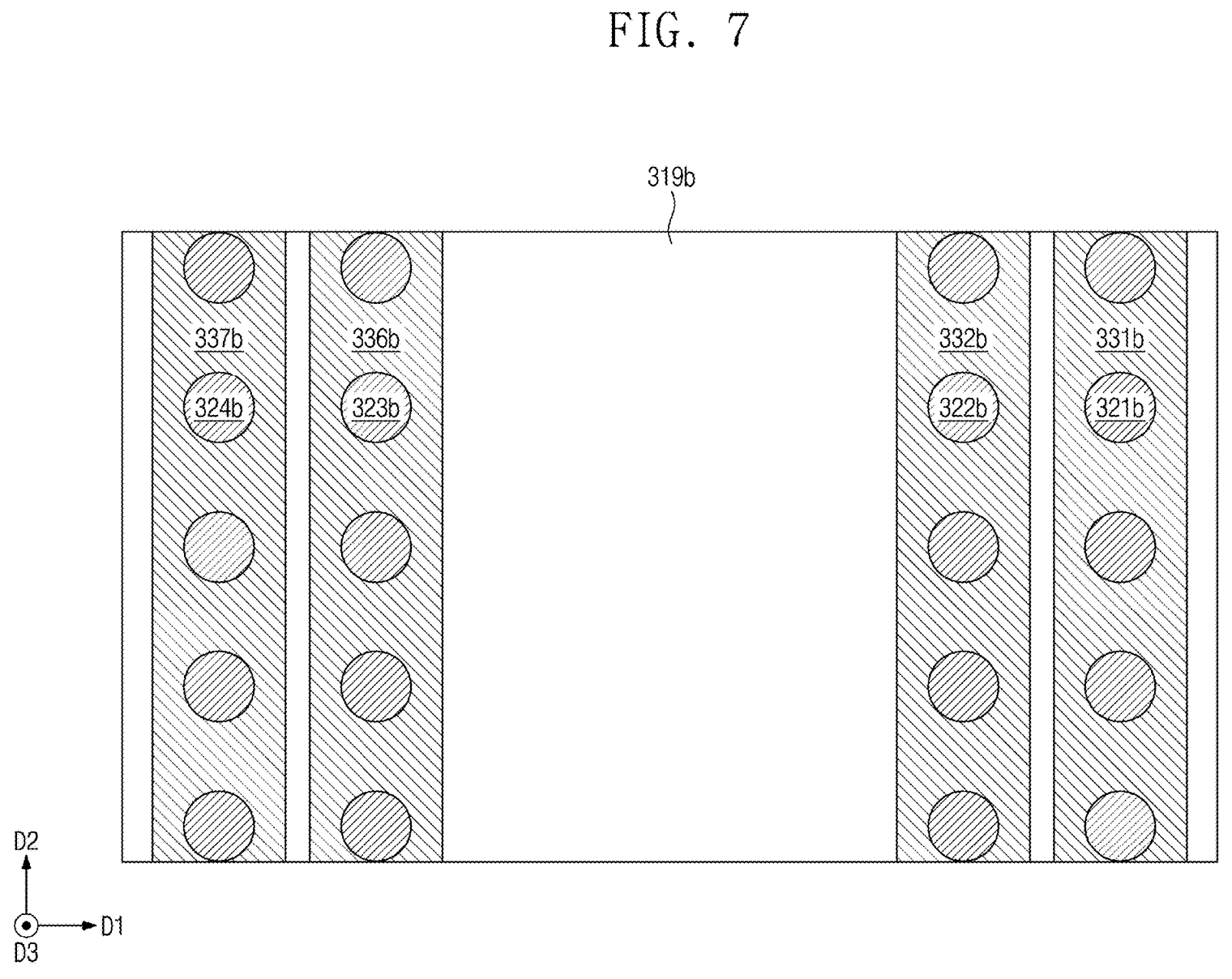
Figure 8:
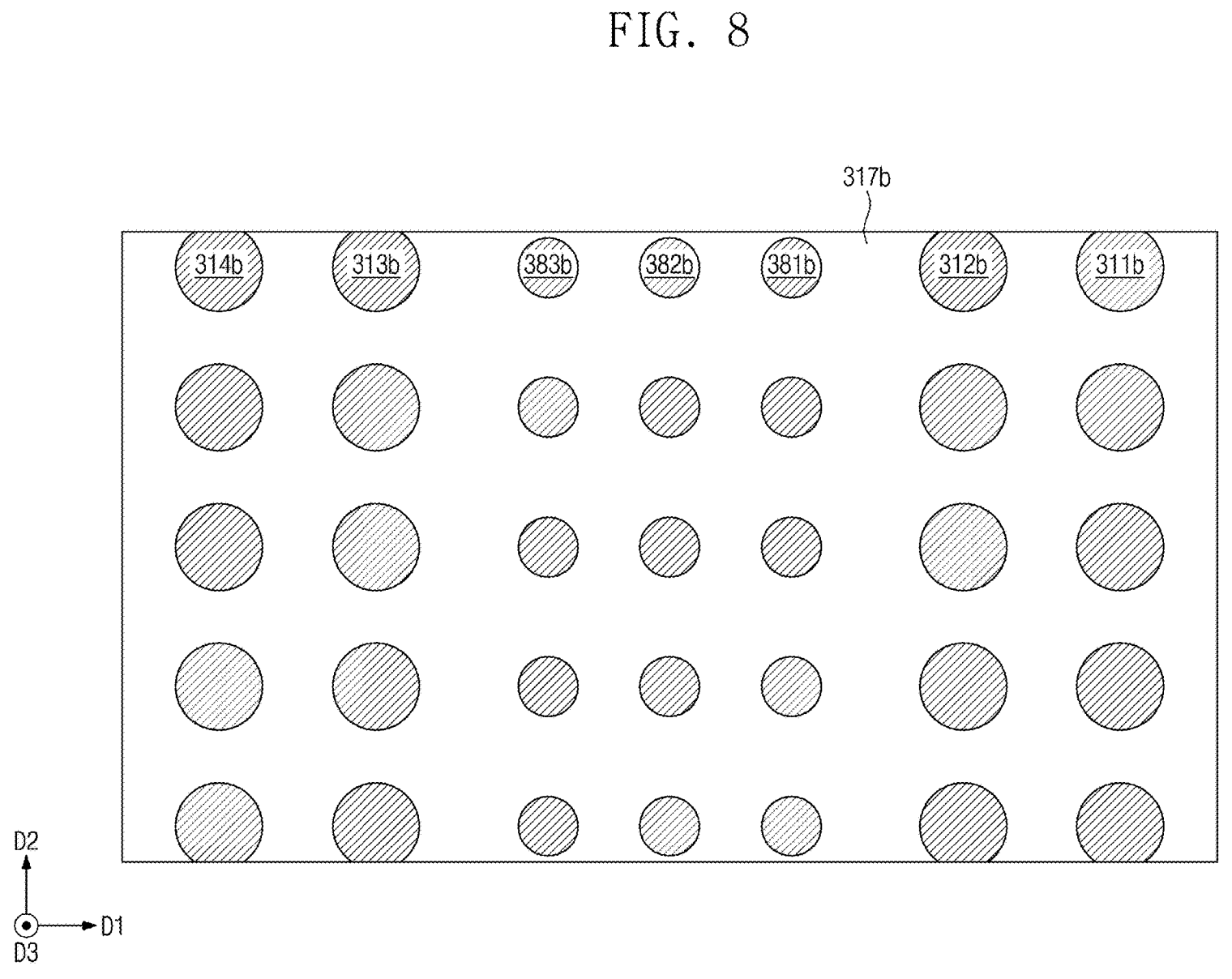
Figure 9:
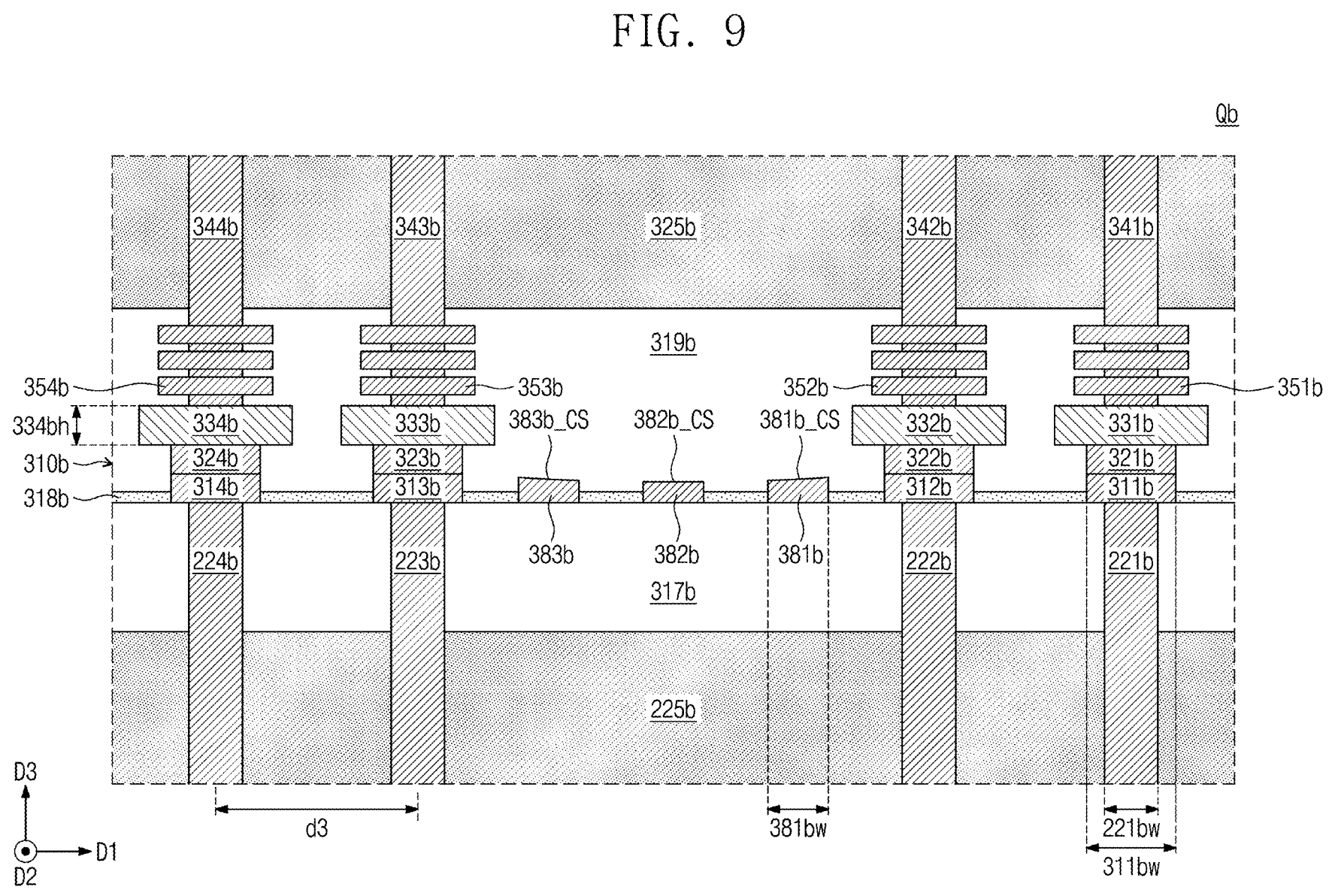
Figure 10:
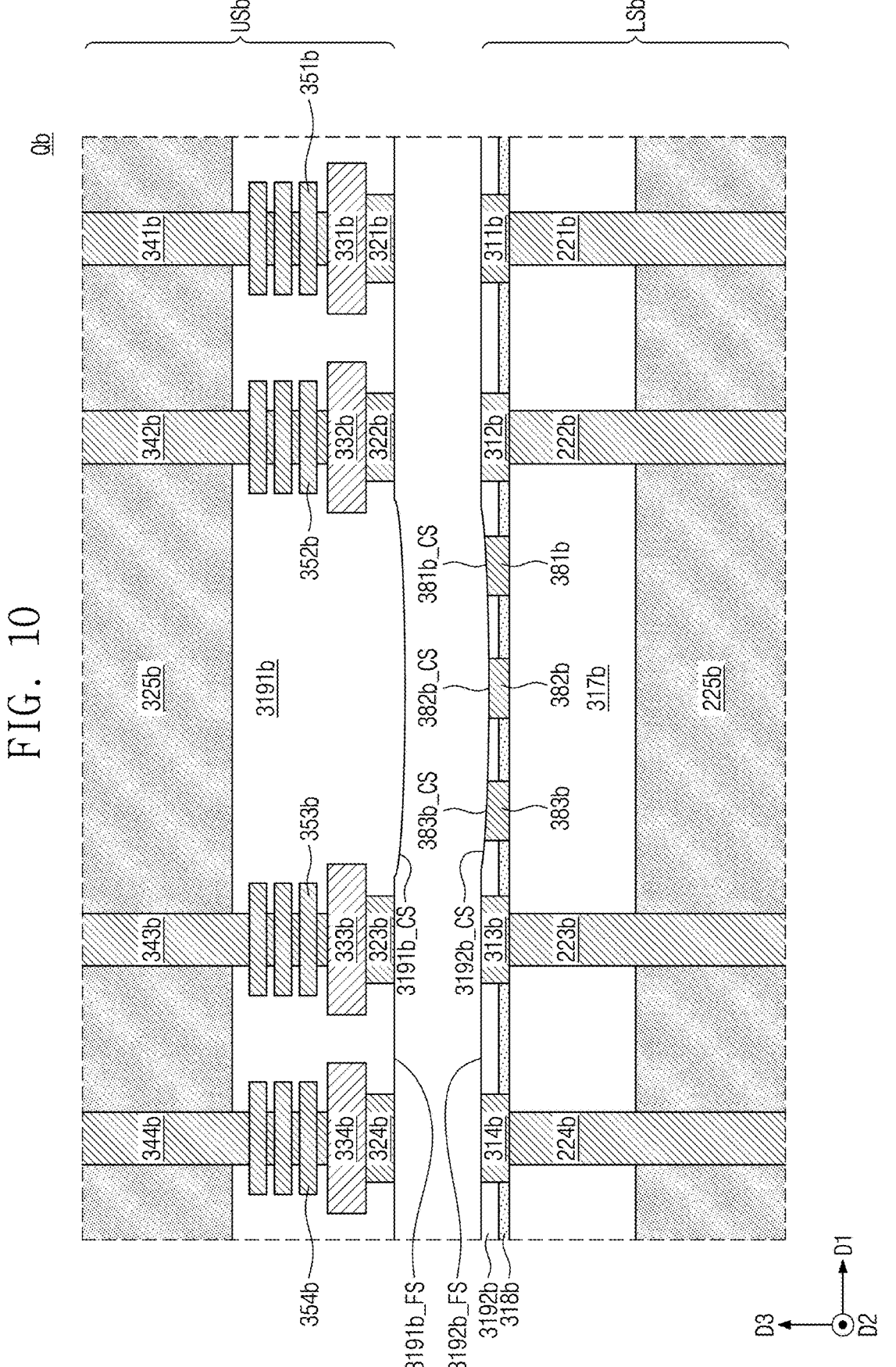
FIG. 10 is a cross-sectional view illustrating bonding between semiconductor substrates according to some embodiments of the disclosure.

FIG. 7 is a plan view illustrating a semiconductor package according to some embodiments of the disclosure. FIG. 8 is a plan view illustrating a semiconductor package according to some embodiments of the disclosure. FIG. 9 is cross-sectional view illustrating section Qb of FIG. 6 according to some embodiments of the disclosure. FIG. 10 is a cross-sectional view illustrating bonding between semiconductor substrates according to some embodiments of the disclosure.

Referring to FIGS. 7, 8, and 9, the second connection structure 310*b* may be interposed between the first semiconductor substrate 225*b* and a second semiconductor substrate 325*b*. The second connection structure 310*b* may be formed by bonding upper and lower structures USb and LSb which will be described below.

The second connection structure 310*b* may include a lower dielectric layer 317*b*, an intervening layer 318*b* on the lower dielectric layer 317*b*, lower connection pads 311*b*, 312*b*, 313*b*, and 314*b* on the lower dielectric layer 317*b*, lower curved pads 381*b*, 382*b*, and 383*b* on the lower dielectric layer 317*b*, a bonding dielectric layer 319*b* on the lower curved pads 381*b*, 382*b*, and 383*b*, upper connection pads 321*b*, 322*b*, 323*b*, and 324*b* on the lower connection pads 311*b*, 312*b*, 313*b*, and 314*b*, upper curved pads 391, 392, and 393 on the lower curved pads 381*b*, 382*b*, and 383*b*, upper connection topmost pads 331*b*, 332*b*, 336*b*, and 337*b* on the upper connection pads 321*b*, 322*b*, 323*b*, and 324*b*, and upper conductive pads 351*b*, 352*b*, 353*b*, and 354*b* on the upper connection topmost pads 331*b*, 332*b*, 336*b*, and 337*b*.

Referring to FIG. 7, in a plan view, the bonding dielectric layer 319*b* may have a plate shape that expands in the first direction D1 and the second direction D2.

The upper connection pads 321*b*, 322*b*, 323*b*, and 324*b* may include a plurality of first upper connection pads 321*b*, a plurality of second upper connection pads 322*b*, a plurality of third upper connection pads 323*b*, and a plurality of fourth upper connection pads 324*b*.

The upper connection topmost pads 331*b*, 332*b*, 336*b*, and 337*b* may include a first connection topmost pad 331*b*, a second connection topmost pad 332*b*, a third connection topmost pad 336*b*, and a fourth connection topmost pad 337*b*. The first, second, third, and fourth connection topmost pads 331*b*, 332*b*, 336*b*, and 337*b* may be spaced apart from each other in the first direction D1.

The first upper connection pads 321*b* may each have a circular shape. The first upper connection pads 321*b* may include a conductive material. The plurality of first upper connection pads 321*b* may be disposed spaced apart from each other in the second direction D2. The first connection topmost pad 331*b* may have a rectangular shape in which a side length in the second direction D2 is greater than a side length in the first direction D1. The first connection topmost pad 331*b* may overlap the plurality of first upper connection pads 321*b*. The above mentioned description may also apply to the second, third, and fourth upper connection pads 322*b*, 323*b*, and 324*b*, and may also true of the second, third, and fourth connection topmost pads 332*b*, 336*b*, and 337*b*.

The first connection topmost pad 331*b* and the second connection topmost pad 332*b* may be adjacent to each other. The third connection topmost pad 336*b* and the fourth connection topmost pad 337*b* may be adjacent to each other. The first upper connection pad 321*b* and the second upper connection pad 322*b* may be adjacent to each other. The third upper connection pad 323*b* and the fourth upper connection pad 324*b* may be adjacent to each other.

A distance between the second connection topmost pad 332*b* and the third connection topmost pad 333*b* may be greater than that between the first connection topmost pad 331*b* and the second connection topmost pad 332*b*.

Referring to FIG. 8, in a plan view, the lower dielectric layer 317*b* may have a plate shape that expands in the first direction D1 and the second direction D2.

The lower connection pads 311*b*, 312*b*, 313*b*, and 314*b* and the lower curved pads 381*b*, 382*b*, and 383*b* may each have a circular shape. The lower curved pads 381*b*, 382*b*, and 383*b* may each have a diameter less than that of each of the lower connection pads 311*b*, 312*b*, 313*b*, and 314*b*.

Referring to FIG. 9, there may be provided a first semiconductor substrate 225, a lower dielectric layer 317*b* on the first semiconductor substrate 225, and lower through structures 221*b*, 222*b*, 223*b*, and 224*b* that penetrate the first semiconductor substrate 225*b* and the lower dielectric layer 317*b*. The lower through structures 221*b*, 222*b*, 223*b*, and 224*b* may include a first lower through structure 221*b*, a second lower through structure 222*b*, a third lower through structure 223*b*, and a fourth lower connection structure 224*b* that are spaced apart from each other.

The lower dielectric layer 317*b* may be provided thereon with a first lower connection pad 311*b*, a second lower connection pad 312*b*, a third lower connection pad 313*b*, a fourth lower connection pad 314*b*, a first lower curved pad 381*b*, a second lower curved pad 382*b*, and a third lower curved pad 383*b* each of which penetrates the intervening layer 318*b*.

The plurality of lower curved pads 381*b*, 382*b*, and 383*b* may be disposed between the plurality of lower connection pads 311*b*, 312*b*, 313*b*, and 314*b*.

The first lower connection pad 311*b* may be disposed on the first lower through structure 221*b*. The first lower connection pad 311*b* may overlap the first lower through structure 211*b*. The second lower connection pad 312*b* may be disposed on the second lower through structure 222*b*. The second lower connection pad 312*b* may overlap the second lower through structure 222*b*. The third lower connection pad 313*b* may be disposed on the third lower through structure 223*b*. The third lower connection pad 313*b* may overlap the third lower through structure 223*b*. The fourth lower connection pad 314*b* may be disposed on the fourth lower through structure 224*b*. The fourth lower connection pad 314*b* may overlap the fourth lower through structure 224*b*.

The first upper connection pad 321*b* may be provided on the first lower connection pad 311*b*. The above mentioned description may also apply to the second, third, and fourth upper connection pads 322*b*, 323*b*, and 324*b* and the second, third, and fourth lower connection pads 312*b*, 313*b*, and 314*b*.

A bottom surface of the first lower curved pad 381*b* may contact a top surface of the lower dielectric layer 317*b*. A bottom surface of the second lower curved pad 382*b* may contact the top surface of the lower dielectric layer 317*b*. A bottom surface of the third lower curved pad 383*b* may contact the top surface of the lower dielectric layer 317*b*.

The first lower curved pad 381*b* may have a curved top surface 381*b*_CS. The second lower curved pad 382*b* may, have a curved top surface 382*b*_CS. The third lower curved pad 383*b* may have a curved top surface 383*b*_CS.

The first connection topmost pad 331*b* may be provided on the first upper connection pad 321*b*. The second connection topmost pad 332*b* may be provided on the second upper connection pad 322*b*. The third connection topmost pad 333*b* may be provided on the third upper connection pad 323*b*. The fourth connection topmost pad 334*b* may be provided on the fourth upper connection pad 324*b*. Upper through structures 341*b*, 342*b*, 343*b*, and 344*b* may penetrate the second semiconductor substrate 325*b*.

The first lower through structure 221*b*, the first lower connection pad 311*b*, and the first connection topmost pad 331*b* may be vertically stacked and sequentially overlap each other (i.e., the width of structure 221*b* is less that the width of pad 311*b*, which is less than the width of pad 331*b*). The second lower through structure 222*b*, the second lower connection pad 312*b*, and the second connection topmost pad 332*b* may be vertically stacked and sequentially overlap each other (i.e., the width of structure 222*b* is less that the width of pad 312*b*, which is less than the width of pad 332*b*). The third lower through structure 223*b*, the third lower connection pad 313*b*, and the third connection topmost pad 333*b* may be vertically stacked and sequentially overlap each other (i.e., the width of structure 223*b* is less that the width of pad 313*b*, which is less than the width of pad 333*b*).

The upper through structures 341*b*, 342*b*, 343*b*, and 344*b* may be disposed on the upper connection topmost pads 331*b*, 332*b*, 333*b*, and 334*b*. A first upper through structure 341*b* may be disposed on the first connection topmost pad 331*b*. A first conductive pad 351*b* may be disposed on the first connection topmost pad 333*b* and overlap the first upper through structure 341*b*. The above mentioned description may also apply to a second upper through structure 342*b*, a second conductive pad 352*b*, a third upper through structure 343*b*, and a third conductive pad 353*b*. The first connection topmost pad 333*b* and the first conductive pad 351*b* may be spaced apart from each other.

A width 221*bw* of the first lower through structure 221*b* may be less than a width 311*bw* of the first lower connection pad 311*b*. A width 381*bw* of the first lower curved pad 381*b* may be less than a width 311*bw* of the first lower connection pad 311*b*. The width 221*bw* of the first lower through structure 221*b* may be, for example, equal to or less than about 4 μm. The width 311*bw* of the first lower connection pad 311*b* may be, for example, equal to or less than about 8 μm. A value of equal to or less than about 30 μm may be given as a distance d3 between the third lower through structure 223*b* and the fourth lower through structure 224*b*. A width of the first connection topmost pad 331*b* may be greater than that of the first upper connection pad 321*b*.

Referring to FIG. 10, there may be provided an upper structure USb and a lower structure LSb immediately before the second connection structure 310*b* is formed. The upper structure USb may be provided on the lower structure LSb. For convenience of description, a detailed explanation of technical features repetitive to that described above may be omitted.

The lower structure LSb may include a first semiconductor substrate 225*b*, a lower dielectric layer 317*b* on the first semiconductor substrate 225*b*, an intervening layer 318*b* on the lower dielectric layer 317*b*, a first curved dielectric layer 3192*b* on the intervening layer 318*b*, lower through structures 221*b*, 222*b*, 223*b*, and 224*b* that penetrate the first semiconductor substrate 225*b* and the lower dielectric layer 317*b*, lower connection pads 311*b*, 312*b*, 313*b*, and 314*b* on the lower through structures 221*b*, 222*b*, 223*b*, and 224*b*, and lower curved pads 381*b*, 382*b*, and 383*b*.

The first curved dielectric layer 3192*b* may include a lower flat surface 3192*b*_FS and a lower curved surface 3192*b*_CS.

The lower flat surface 3192*b*_FS may be a flat portion of a top surface of the first curved dielectric layer 3192*b*.

The lower curved surface 3192*b*_CS may have a downwardly concave shape. The lower curved surface 3192*b*_CS may be coplanar with top surfaces 381*b*_CS, 382*b*_CS, and 383*b*_CS of the lower curved pads 381*b*, 382*b*, and 383*b*.

The lower connection pads 311*b*, 312*b*, 313*b*, and 314*b* may contact the lower through structures 221*b*, 222*b*, 223*b*, and 224*b*.

The upper structure USb may include a second curved dielectric layer 3191*b*, a second semiconductor substrate 325*b* on the second curved dielectric layer 3191*b*, upper connection pads 321*b*, 322*b*, 323*b*, and 324*b* in the second curved dielectric layer 3191*b*, upper connection topmost pads 331*b*, 332*b*, 334*b*, and 335*b* on the upper connection pads 321*b*, 322*b*, 323*b*, and 324*b*, upper through structures 341*b*, 342*b*, 343*b*, and 344*b* that penetrate the second curved dielectric layer 3191*b* and the second semiconductor substrate 325*b*, and upper conductive pads 351*b*, 352*b*, 353*b*, and 354*b* on the upper connection topmost pads 331*b*, 332*b*, 333*b*, and 334*b*.

The second curved dielectric layer 3191*b* may include an upper flat surface 3191*b*_FS and an upper curved surface 3191*b*_CS.

The upper flat surface 3191*b*_FS may be a flat portion of a bottom surface of the second curved dielectric layer 3191*b*. The upper curved surface 3191*b*_CS may have a downwardly concave shape. The lower curved surface 3192*b*_CS may have the same curvature as that of the upper curved surface 3191*b*_CS. The first lower curved pad 381*b* may have the same curvature as that of the upper curved surface 3191*b*_CS.

The upper curved surface 3191*b*_CS may contact the top surface 381*b*_CS of the first lower curved pad 381*b*, the top surface 382*b*_CS of the second lower curved pad 382*b*, and the top surface 383*b*_CS of the third lower curved pad 383*b*. In this case, the first curved dielectric layer 3192*b* and the second curved dielectric layer 3191*b* may be bonded into a single unitary body. The first curved dielectric layer 3192*b* and the second curved dielectric layer 3191*b* may be integrally connected to form the bonding dielectric layer 319*b*.

The upper structure USb and the lower structure LSb may be bonded to each other as described above to form the second connection structure 310 that connects the first semiconductor substrate 225*b* to the second semiconductor substrate 325*b*.

FIGS. 11, 12, 13, 14, 15, 16, 17 and 18 are cross-sectional views illustrating a method of fabricating a semiconductor package according to some embodiments of the disclosure.

FIGS. 11 to 18 depict a method of fabricating a semiconductor package that has a similar structure to that of the lower structure LS illustrated in FIG. 4.

Figure 11:
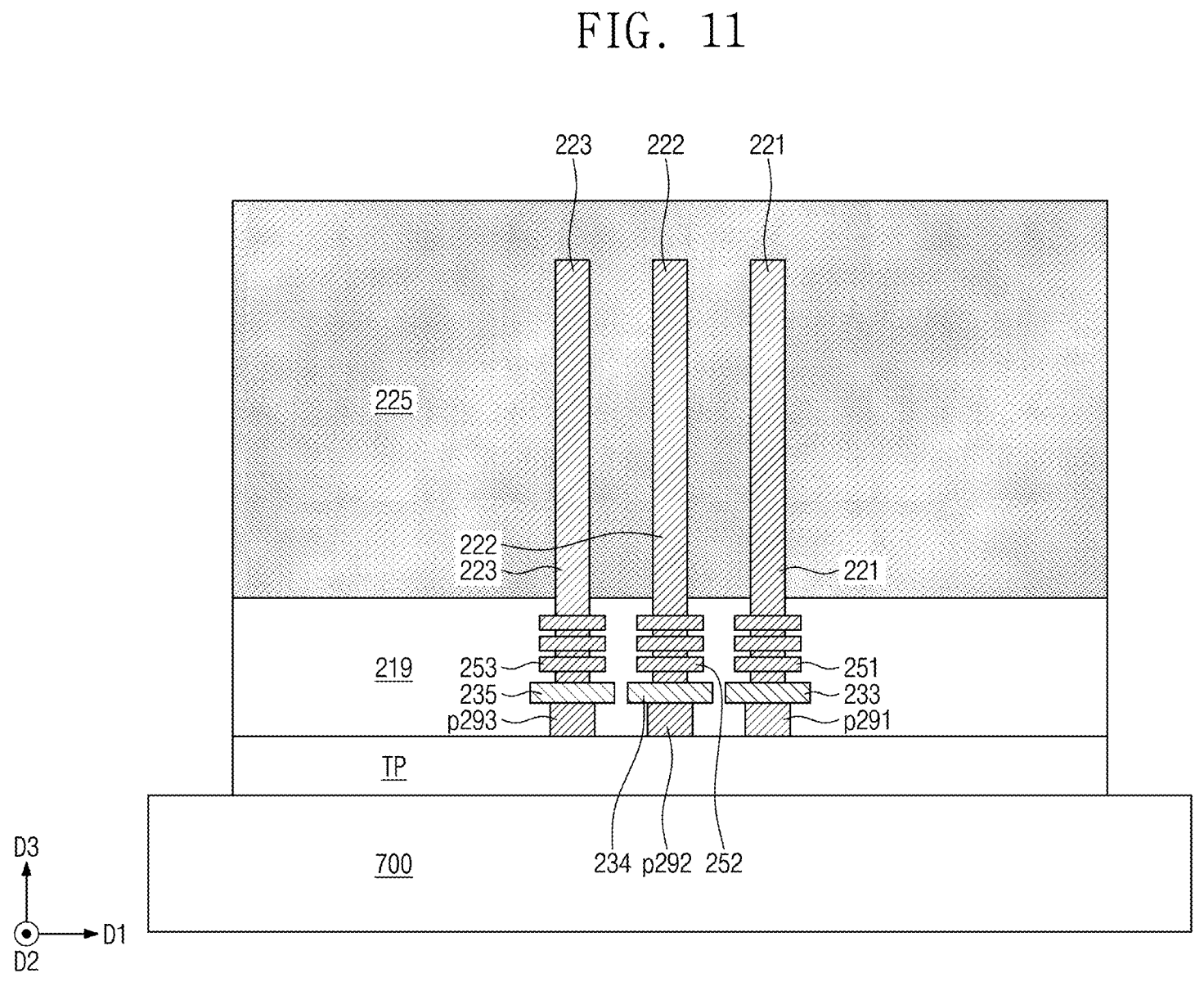

Referring to FIG. 11, there may be provided a carrier substrate 700, a tape TP on the carrier substrate 700, a base dielectric layer 219 on the tape TP, a first semiconductor substrate 225 on the base dielectric layer 219, preliminary upper curved pads p291, p292, and p293 in the base dielectric layer 219, round topmost pads 233, 234, and 235 on the preliminary upper curved pads p291, p292, and p293, conductive pads 251, 252, and 253 on the round topmost pads 233, 234, and 235, and upper through structures 221, 222, and 223.

The tape TP may be formed between the carrier substrate 700 and the base dielectric layer 219. The tape TP may rigidly place the base dielectric layer 219 and the preliminary upper curved pads p291, p292, and p293 on the carrier substrate 700.

The first semiconductor substrate 225 may be formed to cover top surfaces of the upper through structures 221, 222, and 223.

Figure 12:
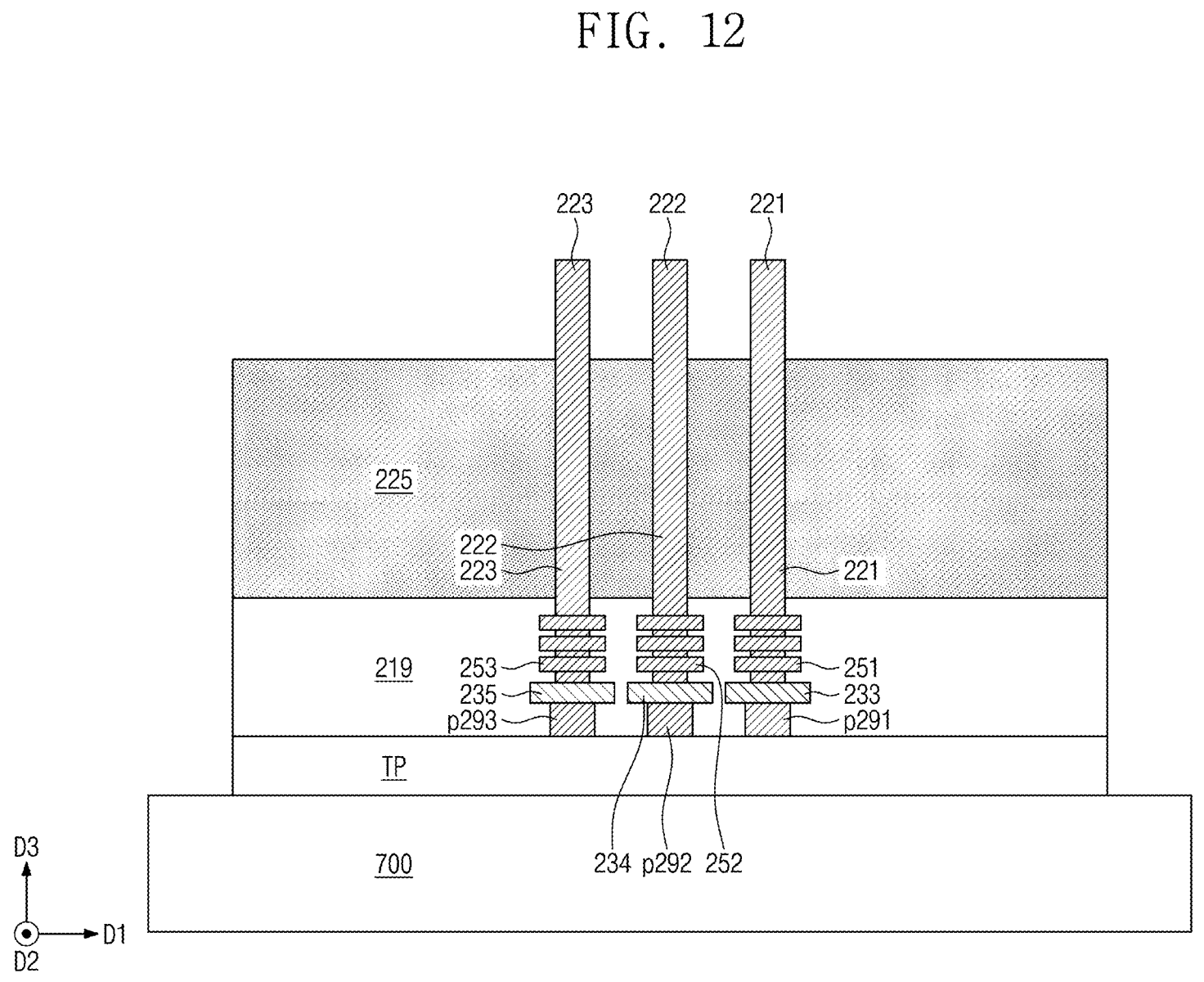

Referring to FIG. 12, the first semiconductor substrate 225 may be selectively etched to expose the top surfaces and portions of lateral surfaces of the upper through structures 221, 222, and 223.

Figure 13:
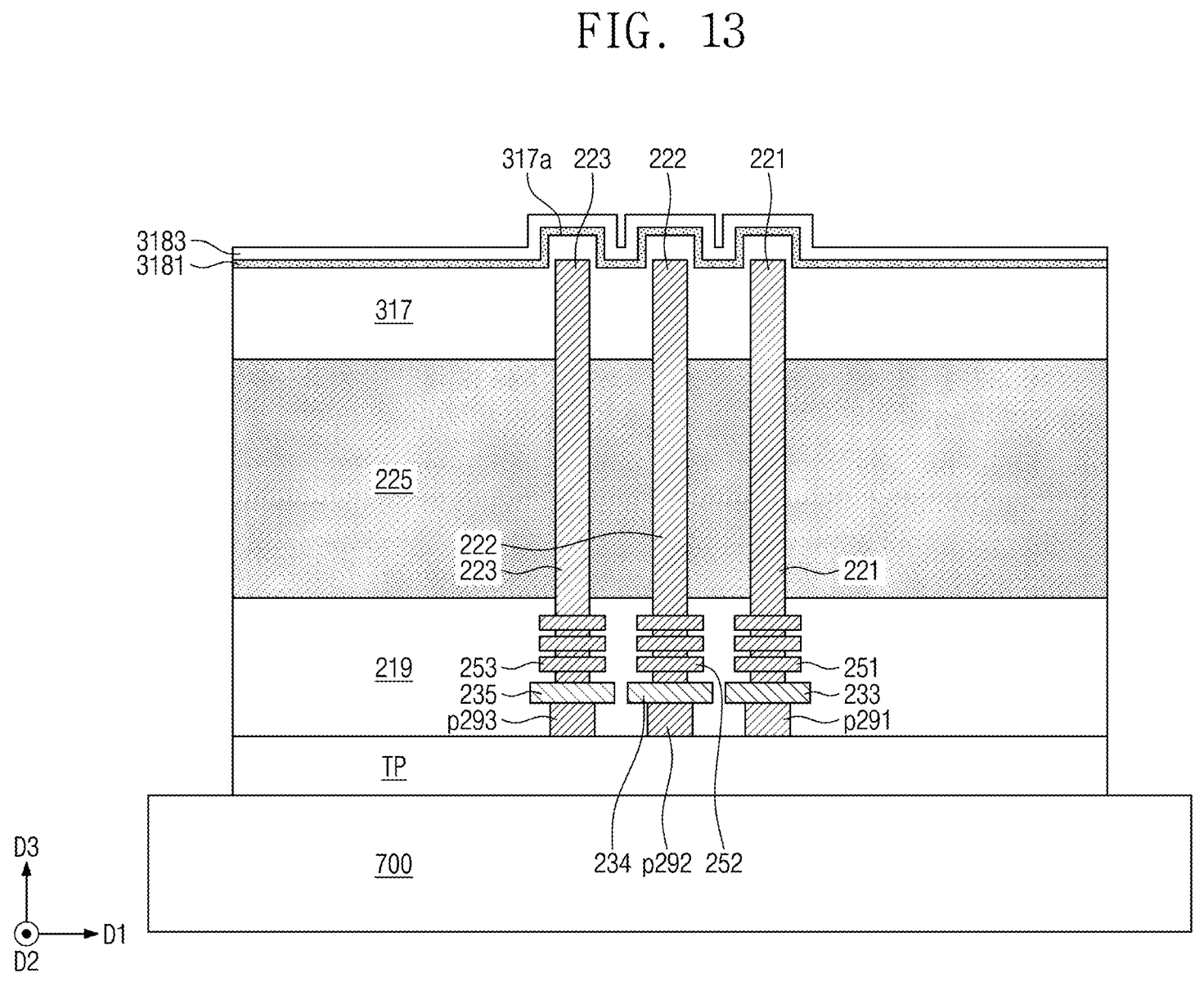

Referring to FIG. 13, a lower dielectric layer 317 may be formed on the first semiconductor substrate 225. The lower dielectric layer 317 may be formed to cover the top surfaces of the upper through structures 221, 222, and 223. A preliminary intervening layer 3181 may be formed on the lower dielectric layer 317. An intermediate dielectric layer 3183 may be formed on the preliminary intervening layer 3181.

The lower dielectric layer 317 may be formed to have protruding portions (e.g., portion 317*a*) that overlap the upper through structures 221, 222, and 222. The lower dielectric layer 317 may be formed to have an uneven shape at its portion that overlaps the upper through structures 221, 222, and 223. The preliminary intervening layer 3181 may be conformally deposited along the lower dielectric layer 317. The intermediate dielectric layer 3183 may be conformally deposited along the preliminary intervening layer 3181.

Figure 14:
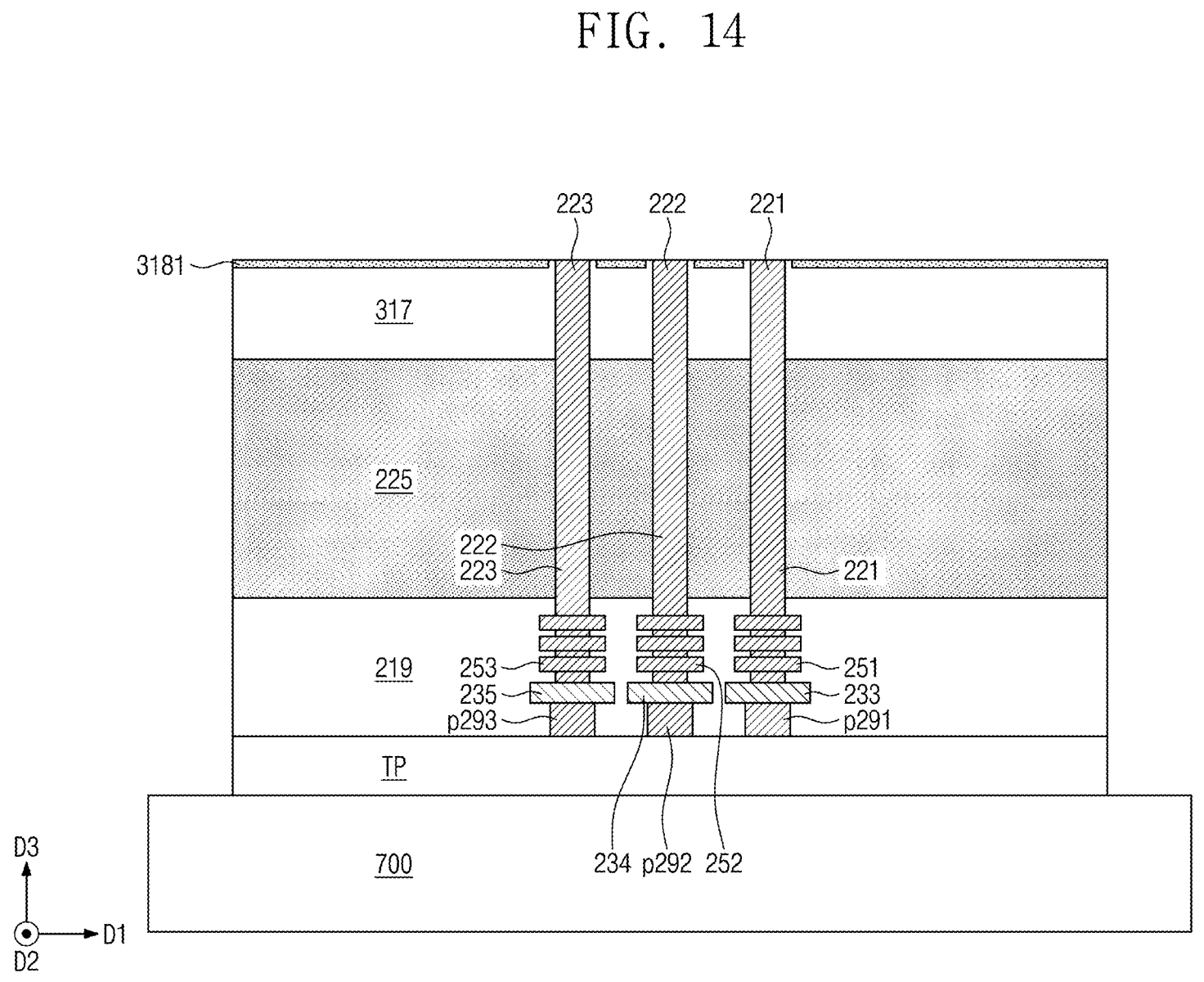

Referring to FIG. 14, the intermediate dielectric layer 3183, the lower dielectric layer 317, and the preliminary intervening layer 3181 may be removed to leave only the lower dielectric layer 317 and the preliminary intervening layer 3181 located at the same level as that of the upper through structures 211, 222, and 223. In this case, the upper through structures 221, 222, and 223 may be exposed at their top surfaces.

Figure 15:
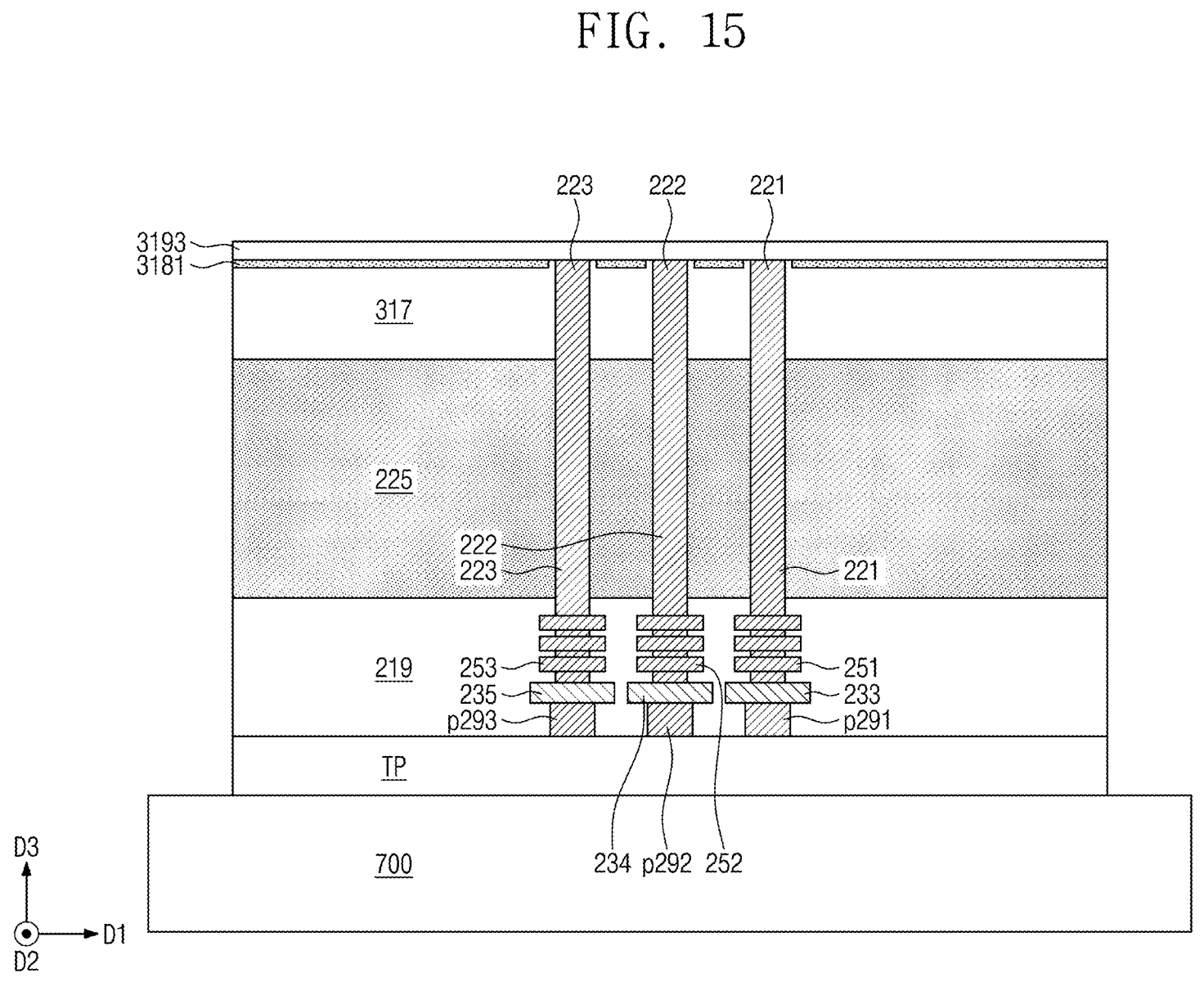

Referring to FIG. 15, a preliminary curved dielectric layer 3193 may be formed on the preliminary intervening layer 3181, the lower dielectric layer 317, and the exposed top surfaces of the upper through structures 211, 222, and 223. The preliminary curved dielectric layer 3193 may contact the exposed top surfaces of the upper through structures 211, 222, and 223. The preliminary curved dielectric layer 3193 may include a different material from that of the preliminary intervening layer 3181. For example, the preliminary curved dielectric layer 3193 may include SiO, and the preliminary intervening layer 3181 may include SiN.

Figure 16:
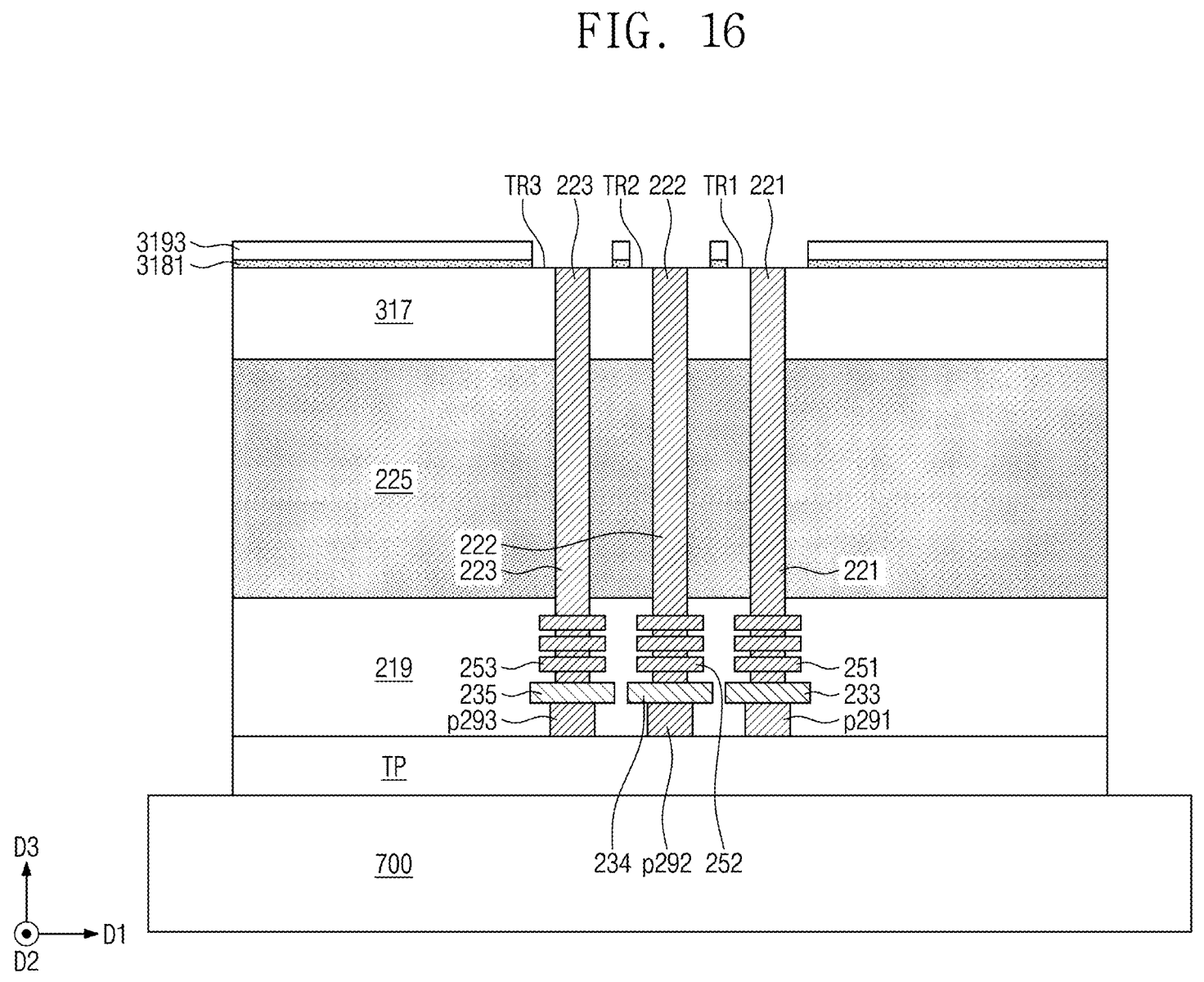

Referring to FIG. 16, the lower dielectric layer 317, the preliminary intervening layer 3181, and the preliminary curved dielectric layer 3193 may be partially removed to form a first trench TR1, a second trench TR2, and a third trench TR3. The first trench TR1 may be formed on the top surface of the first upper through structure 221. The second trench TR2 may be formed on the top surface of the second upper through structure 222. The third trench TR3 may be formed on the top surface of the third upper through structure 223. The first trench TR1 may be formed to allow the preliminary intervening layer 3181 and the preliminary curved dielectric layer 3193 to be exposed on a lateral surface of the first trench TR1. This configuration may also be applied to the second trench TR2 and the third trench TR3.

The first trench TR1 may be formed to have a width greater than that of the first upper through structure 221. The second trench TR2 may be formed to have a width greater than that of the second upper through structure 222. The third trench TR3 may be formed to have a width greater than that of the third upper through structure 223.

Figure 17:
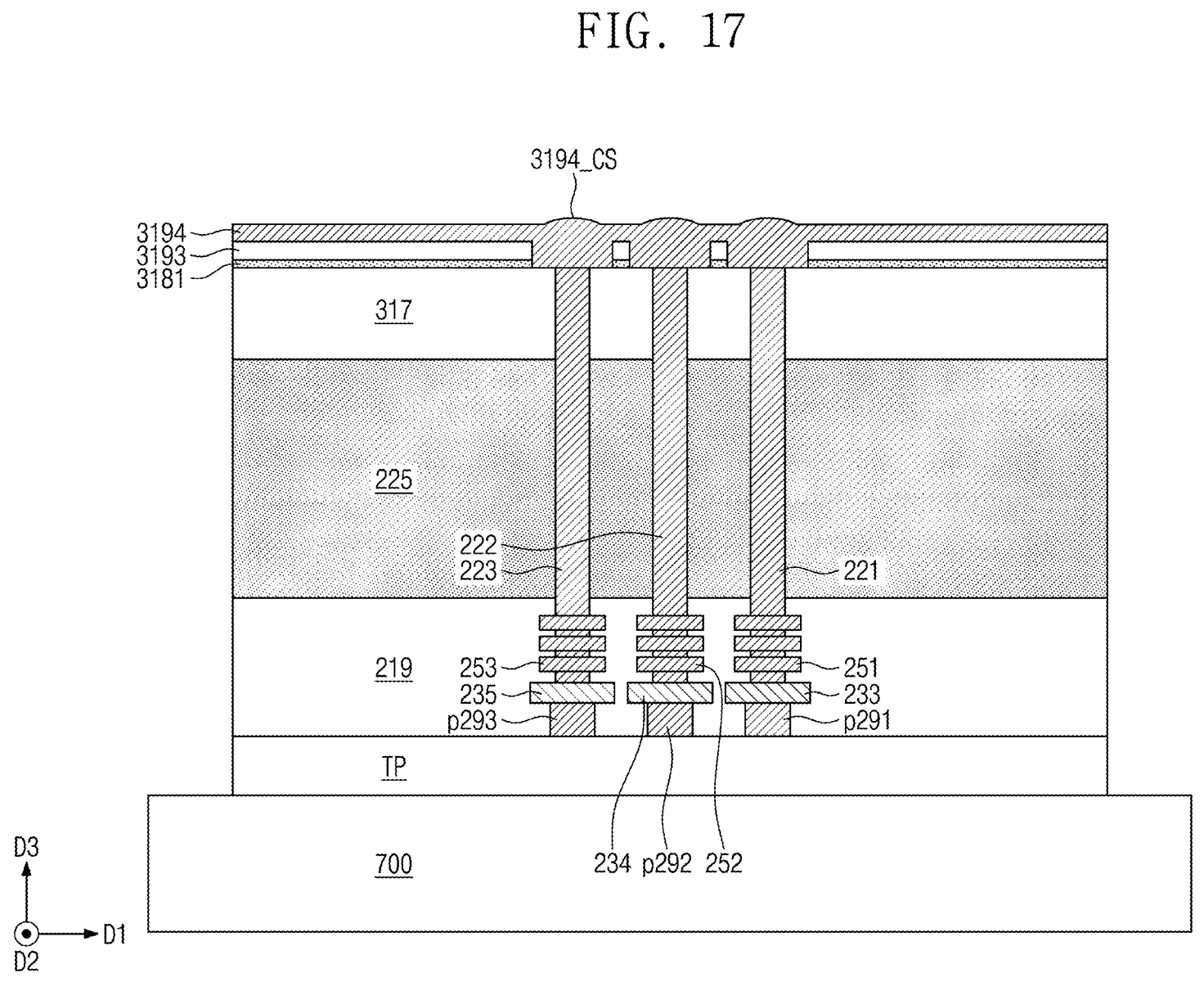

Referring to FIG. 17, a preliminary pad layer 3194 may be formed. The preliminary pad layer 3194 may include a conductive material. The preliminary pad layer 3194 may be formed to fill the first trench TR1, the second trench TR2, and the third trench TR3. The preliminary pad layer 3194 may be formed on the preliminary curved dielectric layer 3193. The preliminary pad layer 3194 may have preliminary pad curved surfaces 3194_CS on its portions that overlap the trenches TR1, TR2, and TR3. The preliminary pad curved surfaces 3194_CS may have an upwardly convex shape.

Figure 18:
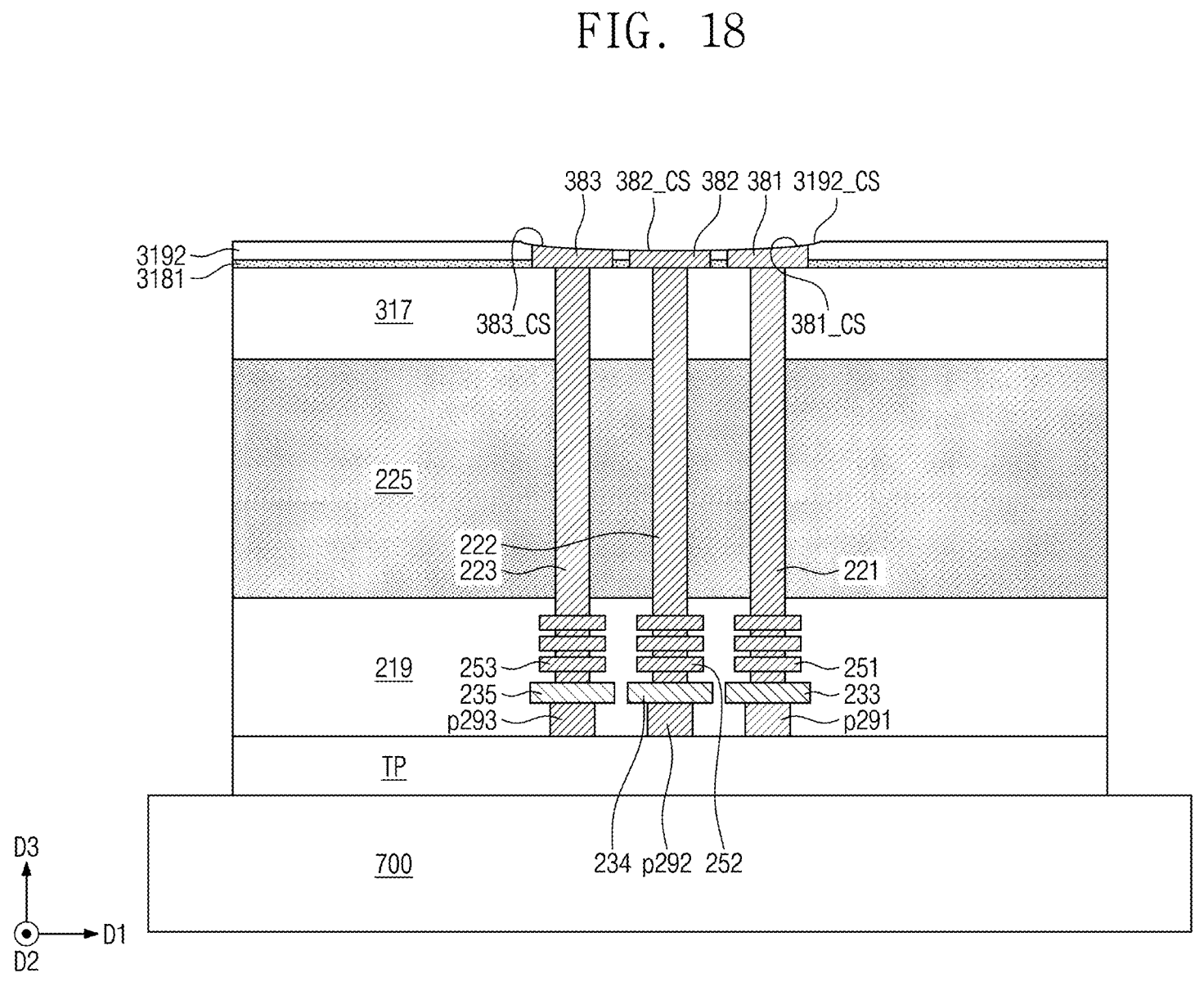

Referring to FIG. 18, the preliminary pad layer 3194 may be etched. The preliminary curved dielectric layer 3193 may be partially etched. The preliminary pad layer 3194 and the preliminary curved dielectric layer 3193 may be partially removed to form a first curved dielectric layer 3192 and a lower curved surface 3192_CS. The preliminary pad layer 3194 located at a higher level than that of a top surface of the preliminary pad layer 3194 may be removed, and the preliminary pad layer 3194 and the preliminary curved dielectric layer 3193 that are located at a higher level than that of the lower curved surface 3192_CS may be removed, which may result in the formation of the first curved dielectric layer 3192 including the lower curved surface 3192_CS.

A non-removed preliminary pad layer 3194 may be formed into lower curved pads 381, 382, and 383. The first trench TR1 below the lower curved surfaces 3192_CS may be filled to form a first lower curved pad 381. The second trench TR2 below the lower curved surface 392_CS may be filled to form a second lower curved pad 382. The third trench TR3 below the lower curved surface 392_CS may be filled to form a third lower curved pad 383. The lower curved surface 3192_CS may include a top surface 381_CS of the first curved pad 381, a top surface 382_CS of the second lower curved pad 382, and a top surface 383_CS of the third lower curved pad 383. Afterwards, the carrier substrate 700 and the tape TP may be removed.

Figure 19:
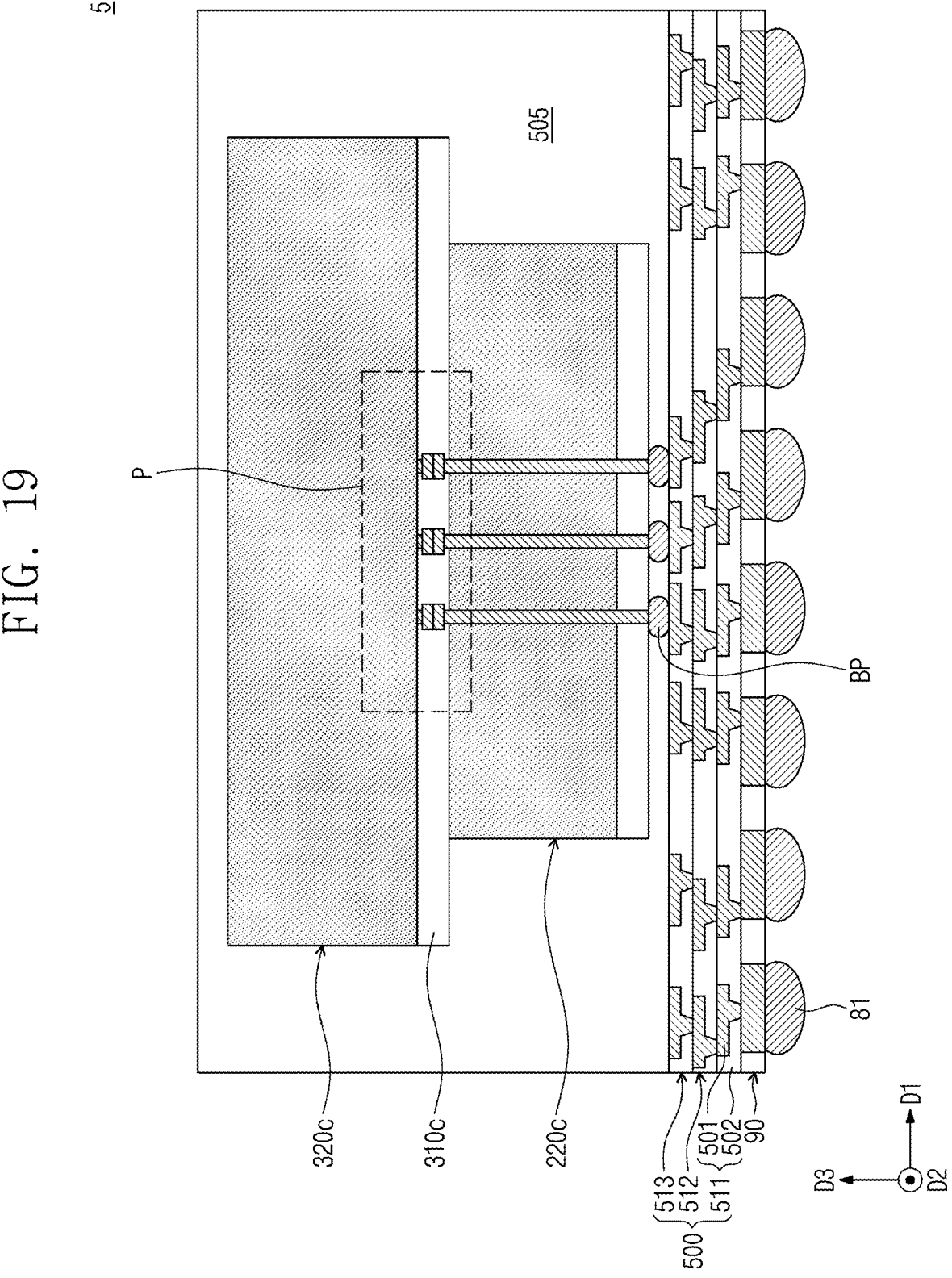
FIG. 19 is a cross-sectional view illustrating a semiconductor package according to some embodiments of the disclosure.
Figure 20:
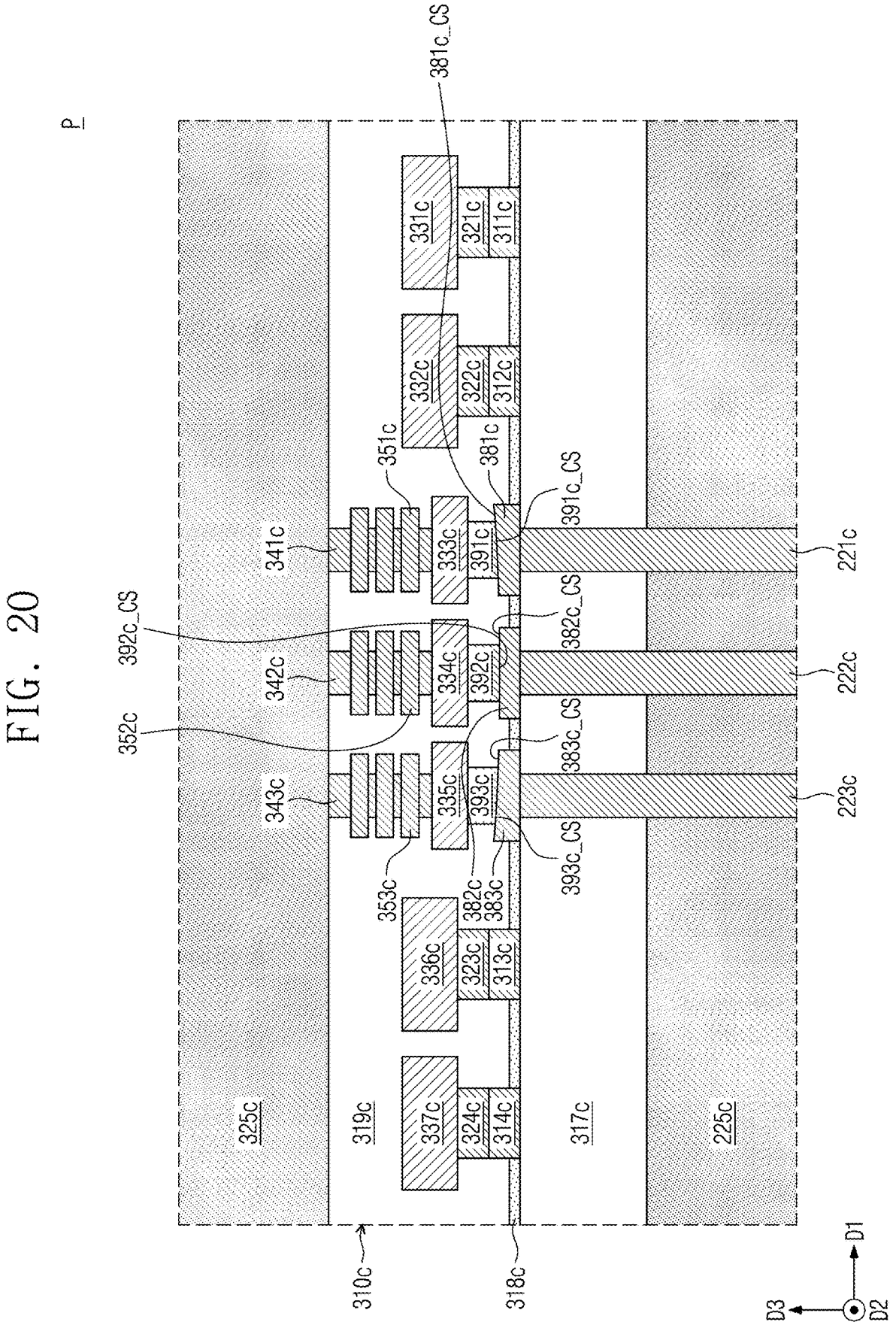
FIG. 20 is a cross-sectional view illustrating portion P of FIG. 19 according to some embodiments of the disclosure.

FIG. 19 is a cross-sectional view illustrating a semiconductor package according to some embodiments of the disclosure. FIG. 20 is a cross-sectional view illustrating portion P of FIG. 19 according to some embodiments of the disclosure. For convenience of description, a detailed explanation of technical features repetitive to that described above may be omitted.

Referring to FIG. 19, a semiconductor package 5 may be provided. The semiconductor package 5 may include a solder ball 81, a solder layer 90 on the solder ball 81, a redistribution structure 500 on the solder layer 90, a bump BP on the redistribution structure 500, a first semiconductor structure 220c on the bump BP, a first connection structure 310c on the first semiconductor structure 220c, a second semiconductor structure 320c on the first connection structure 310c, and a first molding layer 505 on the redistribution structure 500. The first semiconductor structure 220c may have a width less than that of the second semiconductor structure 320c.

The redistribution structure 500 may include a first redistribution layer 511, a second redistribution layer 512 on the first redistribution layer 511, and a third redistribution layer 513 on the second redistribution layer 512. The first redistribution layer 511 may include a first redistribution pattern 501 and a first redistribution dielectric layer 502. The first redistribution pattern 501 may include a conductive material. The above mentioned description of the first redistribution layer 511 may also apply to the second redistribution layer 512 and the third redistribution layer 513.

The first redistribution pattern 501, the solder layer 90, and the solder ball 81 may be electrically connected. The solder layer 90, the first redistribution layer 511, the second redistribution layer 512, and the third redistribution layer 513 may be electrically connected.

The redistribution structure 500 and the first semiconductor structure 220c may be electrically connected through the bump BP. The bump BP may include a conductive material. The bump BP may be interposed between the redistribution structure 500 and the first semiconductor structure 220c.

The first molding layer 505 may be provided to cover a top surface of the redistribution structure 500, a lateral surface of the first semiconductor structure 220c, lateral and top surfaces of the second semiconductor structure 320c, and a bottom surface of the second semiconductor structure 320c not contacting the first semiconductor structure 220c. The first molding layer 505 may include a dielectric material.

Referring to FIG. 20, there may be provided a first semiconductor substrate 225c, lower through structures 221c, 222c, and 223c, a first connection structure 310c on the first semiconductor substrate 225c, and a second semiconductor substrate 325c on the first connection structure 310c.

The first connection structure 310c may be interposed between the first semiconductor substrate 225c and the second semiconductor substrate 325c. The first connection structure 310c may include a lower dielectric layer 317c, an intervening layer 318c on the lower dielectric layer 317c, lower connection pads 311c, 312c, 313c, and 314c on the lower dielectric layer 317c, lower curved pads 381c, 382c, and 383c on the lower dielectric layer 317c, a bonding dielectric layer 319c on the intervening layer 318c, upper connection pads 321c, 322c, 323c, and 324c on the lower connection pads 311c, 312c, 313c, and 314c, upper curved pads 391c, 392c, and 393c on the lower curved pads 381c, 382c, and 383c, upper connection topmost pads 331c, 332c, 336c, and 337c on the upper connection pads 321c, 322c, 323c, and 324c, upper round topmost pads 333c, 334c, and 335c on the upper curved pads 391c, 392c, and 393c, and upper conductive pads 351c, 352c, and 353c on the upper round topmost pads 333c, 334c, and 335c.

Top surfaces 381c_CS, 382c_CS, and 383c_CS of the lower curved pads 381c, 382c, and 383c may contact bottom surfaces 391c_CS, 391c_CS, and 393c_CS of the upper curved pads 391c, 392c, and 393c.

Upper through structures 341c, 342c, and 343c may be provided on the upper round topmost pads 333c, 334c, and 335c. The upper through structures 341c, 342c, and 343c may include a first upper through structure 341c, a second upper through structure 342c, and a third upper through structure 343c.

The first upper through structure 341c may be disposed on a first round topmost pad 333c. A first conductive pad 351c may be disposed on the first round topmost pad 333c and overlap the first upper through structure 341c. The above mentioned description may also apply to the second upper through structure 342c, a second conductive pad 352c, the third upper through structure 343c, and a third conductive pad 353c.

The first upper through structure 341c may have a top surface coplanar with that of the bonding dielectric layer 319c. This configuration may also apply to the second upper through structure 342c and the third upper through structure 343c.

Figure 21:
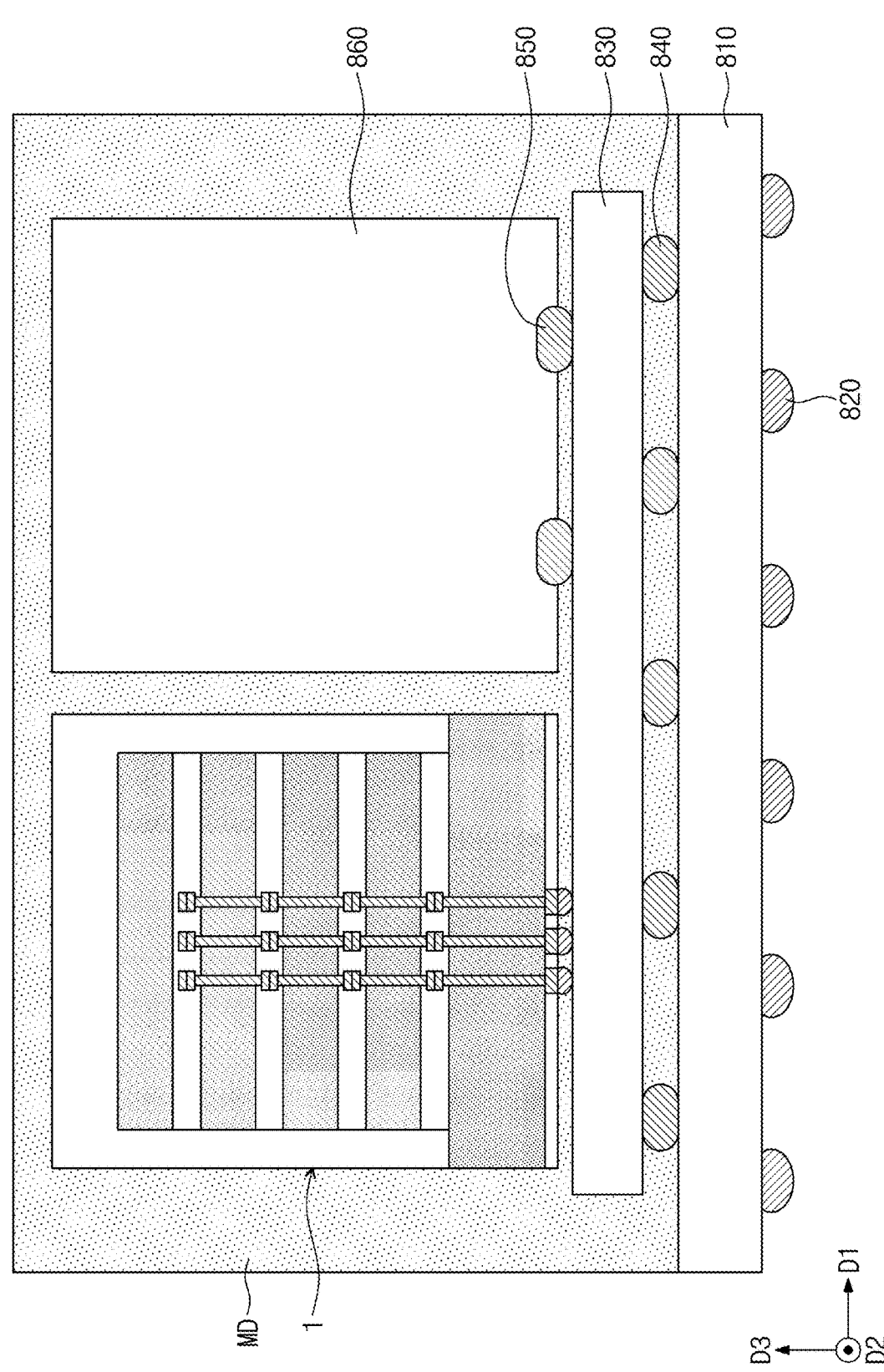
FIG. 21 is a cross-sectional view illustrating a semiconductor package according to some embodiments of the disclosure.

FIG. 21 is a cross-sectional view illustrating a semiconductor package according to some embodiments of the disclosure.

Referring to FIG. 21, a semiconductor package may include a package substrate 810. First terminals 820 may be provided which are electrically connected to the package substrate 810. The semiconductor package may be mounted through the first terminals 820 to an external apparatus (e.g., main board).

An interposer 830 may be provided on the package substrate 810. Second terminals 840 may be provided to electrically connect the package substrate 810 to the interposer 830. The second terminals 840 may be provided between the package substrate 810 and the interposer 830.

A processor chip 860 may be provided on the interposer 830. For example, the processor chip 860 may be a graphic processing unit (GPU) or a central processing unit (CPU).

Third terminals 850 may be provided to electrically connect the processor chip 860 to the interposer 830. The third terminals 850 may be provided between the processor chip 860 and the interposer 830.

The semiconductor package 1 of FIG. 1 may be provided on the interposer 830. The semiconductor package 1 may be spaced apart in the first direction D1 from the processor chip 860. Solder balls may be provided to electrically connect the semiconductor package 1 to the interposer 830.

The package substrate 810 may be provided thereon with a molding layer MD that surrounds the interposer 830, the processor chip 860, and the semiconductor package 1.

A semiconductor package according to some embodiments of the disclosure may be configured such that curved surfaces of a dielectric layer and curved surfaces of a pad may contact each other when an upper structure and a lower structure contact each other, and thus alleviation of topology of semiconductor structures may be achieved.

Each of the embodiments provided in the above description is not excluded from being associated with one or more features of another example or another embodiment also provided herein or not provided herein but consistent with the disclosure.

While the disclosure has been particularly shown and described with reference to embodiments thereof, it will be understood that various changes in form and details may be made therein without departing from the spirit and scope of the following claims.

What is claimed is:

1. A semiconductor package, comprising:
a first semiconductor structure comprising a first semiconductor substrate and a lower through structure that penetrates the first semiconductor substrate;
a connection structure on the first semiconductor structure; and
a second semiconductor structure on the connection structure, the second semiconductor structure comprising a second semiconductor substrate and an upper through structure that penetrates the second semiconductor substrate,
wherein the connection structure comprises:
a lower curved pad on the lower through structure; and
an upper curved pad on the lower curved pad,
wherein a top surface of the lower curved pad comprises a curved surface,
wherein a bottom surface of the upper curved pad comprises a curved surface, and
wherein the upper curved pad is connected to the upper through structure.

2. The semiconductor package of claim 1, wherein the connection structure further comprises:
a plurality of upper conductive pads contacting the upper through structure; and
a first top pad on the upper curved pad, and
wherein a width of the plurality of upper conductive pads is less than a width of the first top pad.

3. The semiconductor package of claim 1, wherein the connection structure further comprises:
an upper connection pad spaced apart from the upper curved pad;
a first top pad on the upper curved pad; and
a connection topmost pad on the upper connection pad, and
wherein a width of the connection topmost pad is greater than a width of the first top pad.

4. The semiconductor package of claim 1, wherein the connection structure further comprises:

a lower dielectric layer on the first semiconductor substrate; and
a lower connection pad spaced apart from the lower curved pad,
wherein an entirety of a bottom surface of the lower connection pad contacts the lower dielectric layer, and
wherein a bottom surface of the lower curved pad contacts the lower through structure.

5. The semiconductor package of claim 4, wherein the top surface of the lower curved pad is at a level that is lower than a level of a top surface of the lower connection pad.

6. The semiconductor package of claim 1, wherein the connection structure further comprises:
a lower dielectric layer on the first semiconductor substrate; and
an intervening layer on the lower dielectric layer, and
wherein a top surface of the intervening layer is at a level that is lower than a level of the top surface of the lower curved pad.

7. The semiconductor package of claim 1, wherein the connection structure further comprises a first top pad on the upper curved pad, and
wherein the first top pad comprises a material that is different from a material of the upper curved pad.

8. The semiconductor package of claim 7, wherein the top surface of the lower curved pad has a curvature that is substantially the same as a curvature of the bottom surface of the upper curved pad.

9. The semiconductor package of claim 1, wherein the connection structure further comprises:
an upper connection pad spaced apart from the upper curved pad;
a first top pad on the upper curved pad; and
a connection topmost pad on the upper connection pad, and
wherein a top surface of the connection topmost pad is at a level that is higher than a level of a top surface of the first top pad.

10. The semiconductor package of claim 9, wherein the connection structure further comprises a bonding dielectric layer below the second semiconductor substrate,
wherein an entirety of the top surface of the connection topmost pad contacts the bonding dielectric layer, and
wherein the top surface of the first top pad contacts the upper through structure.

11. A semiconductor package, comprising:
a first semiconductor structure comprising a first semiconductor substrate and a lower through structure that penetrates the first semiconductor substrate;
a connection structure on the first semiconductor structure; and
a second semiconductor structure on the connection structure, the second semiconductor structure comprising a second semiconductor substrate and an upper through structure that penetrates the second semiconductor substrate,
wherein the connection structure comprises:
a lower dielectric layer on the first semiconductor substrate;
at least one lower curved pad on the lower dielectric layer and connected to the lower through structure; and
at least one lower connection pad on the lower dielectric layer and spaced apart from the at least one lower curved pad, and wherein a top surface of the at least one lower curved pad is at a level that is lower than a level of a top surface of the at least one lower connection pad.

12. The semiconductor package of claim 11, wherein the connection structure further comprises an upper curved pad on the at least one lower curved pad, wherein the top surface of the at least one lower curved pad comprises a curved surface, wherein a bottom surface of the upper curved pad comprises a curved surface, and wherein the top surface of the at least one lower connection pad comprises a flat surface.

13. The semiconductor package of claim 12, wherein the bottom surface of the upper curved pad has a curvature that is substantially the same as a curvature of the top surface of the at least one lower curved pad.

14. The semiconductor package of claim 11, wherein a width of the at least one lower curved pad is less than a width of the at least one lower connection pad.

15. The semiconductor package of claim 11, wherein the connection structure further comprises:

an upper connection pad on the at least one lower connection pad; and a connection topmost pad on the upper connection pad, wherein the lower through structure at least partially overlaps the at least one lower connection pad, and wherein the at least one lower connection pad at least partially overlaps the connection topmost pad.

16. The semiconductor package of claim 11, wherein the connection structure further comprises:

an upper connection pad on the at least one lower connection pad; and a connection topmost pad on the upper connection pad, and wherein a width of the connection topmost pad is greater than a width of the upper connection pad.

17. The semiconductor package of claim 11, wherein the connection structure further comprises:

an upper connection pad on the at least one lower connection pad; and a bonding dielectric layer below the second semiconductor substrate, wherein the at least one lower connection pad contacts the upper connection pad, and wherein an entirety of the top surface of the at least one lower curved pad contacts the bonding dielectric layer.

18. The semiconductor package of claim 11, further comprising:

a plurality of lower connection pads, the at least one lower connection pad being among the plurality of lower connection pads, and a plurality of lower curved pads, the at least one lower curved pad being among the plurality of lower curved pads, wherein the plurality of lower curved pads are respectively between the plurality of lower connection pads.

19. A semiconductor package, comprising:

a first semiconductor structure comprising a first semiconductor substrate and a lower through structure that penetrates the first semiconductor substrate;

a connection structure on the first semiconductor structure; and a second semiconductor structure on the connection structure, the second semiconductor structure comprising a second semiconductor substrate and an upper through structure that penetrates the second semiconductor substrate, wherein the connection structure comprises:

a lower dielectric layer on the first semiconductor substrate;

an intervening layer on the lower dielectric layer;

a lower curved pad on the lower through structure; and an upper curved pad on the lower curved pad, wherein a top surface of the lower curved pad comprises a curved surface, wherein a bottom surface of the upper curved pad comprises a curved surface, wherein the upper curved pad is connected to the upper through structure, and wherein a top surface of the intervening layer is at a level that is lower than a level of the top surface of the lower curved pad.

20. The semiconductor package of claim 19, wherein the intervening layer comprises silicon nitride, and wherein the lower dielectric layer comprises silicon oxide.

* * * * *